(12) United States Patent
Shindo

(10) Patent No.: US 8,159,653 B2
(45) Date of Patent: Apr. 17, 2012

(54) SUBSTRATE POSITION DETECTION APPARATUS, AND METHOD OF ADJUSTING A POSITION OF AN IMAGING COMPONENT OF THE SAME

(75) Inventor: Takehiro Shindo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 506 days.

(21) Appl. No.: 12/523,188

(22) PCT Filed: Feb. 12, 2008

(86) PCT No.: PCT/JP2008/052260
§ 371 (c)(1),
(2), (4) Date: Jul. 15, 2009

(87) PCT Pub. No.: WO2008/099808
PCT Pub. Date: Aug. 21, 2008

(65) Prior Publication Data
US 2010/0033706 A1   Feb. 11, 2010

(30) Foreign Application Priority Data

Feb. 13, 2007 (JP) ................................ 2007-032487

(51) Int. Cl.
*G03B 27/58* (2006.01)
(52) U.S. Cl. .......................................... 355/72; 355/53
(58) Field of Classification Search ................ 355/53, 355/72
See application file for complete search history.

(56) References Cited

FOREIGN PATENT DOCUMENTS

| JP | 2002-280287 | 9/2002 |
|----|-------------|--------|
| JP | 2003-50106  | 2/2003 |
| JP | 2003-51535  | 2/2003 |
| JP | 2004-193171 | 7/2004 |

*Primary Examiner* — Edward Glick
*Assistant Examiner* — Mesfin T Asfaw
(74) *Attorney, Agent, or Firm* — IPUSA, PLLC

(57) ABSTRACT

A method is disclosed for adjusting an arrangement of coordinates in an imaging area of an imaging component in a substrate imaging plane in a substrate position detection apparatus that detects a position of a substrate in accordance with an image taken of a circumferential portion of the substrate by the imaging component, the apparatus being arranged near a rotatable susceptor on which the substrate is placed and a substrate transferring apparatus prepared separately from the susceptor and configured to horizontally drive a supporting pin for transferring the substrate to and/or from the susceptor. This method includes supporting at a predetermined height above the susceptor by the supporting pin a mark-equipped wafer with a mark arranged corresponding to the circumferential portion of the substrate, bringing the mark into the imaging area, detecting the mark at plural points while horizontally moving the mark in one direction within the imaging area by a predetermined distance by horizontally driving the supporting pin, and calibrating an axis direction of the coordinates in accordance with a direction in which the plural points are arranged; and maintaining the mark-equipped wafer with a height adjustment jig at the predetermined height above the susceptor, bringing the mark into the imaging area, detecting the mark at plural points while moving the mark within the imaging area by a predetermined angle by rotating the susceptor, and calibrating an origin position of the coordinates in accordance with a rotation center obtained in accordance with the plural points.

8 Claims, 21 Drawing Sheets

SUBSTRATE POSITION DETECTION APPARATUS, AND METHOD OF ADJUSTING A POSITION OF AN IMAGING COMPONENT OF THE SAME

TECHNICAL FIELD

The present invention relates to a substrate position detection apparatus, and method of adjusting a position of an imaging component of the same.

BACKGROUND ART

Generally, various processes such as a thin film deposition process, an etching process, and a thermal process are repeatedly carried out on a substrate subject to these processes, for example, a semiconductor wafer (simply referred to as a wafer, hereinafter) to produce integrated circuits on the wafer in a fabrication process of semiconductor integrated circuits. In addition, predetermined post-treatments may also be carried out on the wafer that has undergone each of the processes. As the post-treatments, there may be a process for cleaning the wafer, an example of which is a residue removal process for removing residues remaining on the wafer, a process for measuring process results, an example of which is a thickness measurement process, a particle measurement process, and the like.

Such treatments are carried out in a substrate process apparatus including process chambers that are configured so that a predetermined process such as a plasma process and a measurement process can be carried out. The substrate process apparatus includes, for example, a transfer robot having a pivotable and retractable transfer arm for transferring the wafer. Generally, a susceptor on which the wafer is placed is provided in the process chambers and the wafer is transferred between the susceptor and the transfer arm.

In order to appropriately carry out a process on the wafer placed on the susceptor, the wafer has to be placed in an accurate position without horizontal (X- and Y-directional) displacements. To this end, when the displacements are found after a wafer position is first detected, the displacements are corrected in order to correct the wafer position.

In recent years, an imaging component such as a charge coupled device (CCD) camera has been used in order to accurately detect the wafer position. Namely, an image of a wafer circumference portion is taken by the imaging component, and wafer displacement is detected in accordance with the obtained image data (see Patent Document 1, for example). When the wafer displacement is detected in accordance with the image data obtained by the imaging component, coordinates of the imaging component need to be accurately determined on reference coordinates (XY coordinates) in advance. Conventionally, the X-axis direction, the Y-axis direction, and the origin position of the reference coordinates have been determined in accordance with a design-based position of the imaging component and the like.

Patent Document 1: Japanese Laid-Open Patent Application No. 2002-280287
Patent Document 2: Japanese Laid-Open Patent Application No. 2003-50106

SUMMARY OF INVENTION

Problems to be Solved by the Invention

However, a position of the imaging component with respect to the design-based origin position of the reference coordinates may be in disagreement with a real position of the imaging component due to installation errors and the like of the imaging component. If such disagreement exists between the position of the imaging component on the reference coordinates and the real position of the imaging component, displacement of a center position of the wafer with respect to the origin position of the reference coordinates cannot be precisely detected, regardless of a degree of the disagreement.

In addition, not only the origin position but also the X-axis direction and Y-axis direction of the reference coordinates are in disagreement with the real X-axis direction and Y-axis direction due to the installation errors and the like of the imaging component. In this situation, even if the displacement of the center position of the wafer with respect to the origin position of the reference coordinates can be precisely detected, the wafer position cannot be precisely corrected when the wafer position is corrected in the X-axis direction and Y-axis direction. To this end, the coordinate position of the imaging component is required to be precisely adjusted in advance.

In this regard, Patent Document 2 describes use of an apparatus having a rotatable table that is also movable in the X and Y directions, in which the coordinate position of the imaging component is adjusted by detecting a mark provided in the table. However, in such an apparatus, when the table is moved in the X and Y-directions, the rotational center of the table is also moved; and when the table is rotated, the X and Y directions are displaced. Therefore, a complicated method is required to correct the coordinate position of the imaging component.

The present invention has been made in view of such a problem, and is directed to a substrate position detection apparatus and a method of adjusting a position of an imaging component of the same that are capable of adjusting the coordinate position of the imaging component in a simple manner and thus precisely detecting a substrate position.

Means of Solving the Problems

In order to solve the above problem, according to a first aspect of the present invention, there is provided an imaging component position adjustment method for adjusting an arrangement of coordinates in an imaging area of an imaging component in a substrate imaging plane in a substrate position detection apparatus that detects a position of a substrate in accordance with an image taken of a circumferential portion of the substrate by the imaging component, the substrate position detection apparatus being arranged in a vicinity of a rotatable susceptor on which the substrate is placed and a substrate transferring apparatus that is prepared separately from the susceptor and configured to horizontally drive a supporting pin for transferring the substrate to and/or from the susceptor. The imaging component position adjustment method includes steps of: supporting a mark-equipped wafer in which a mark is arranged corresponding to the circumferential portion of the substrate at a predetermined height above the susceptor by the supporting pin, bringing the mark into the imaging area, detecting the mark at plural points while horizontally moving the mark in one direction within the imaging area by a predetermined distance by horizontally driving the supporting pin, and calibrating an axis direction of the coordinates in accordance with a direction in which the plural points are arranged; and maintaining the mark-equipped wafer with a height adjustment jig at the predetermined height above the susceptor, bringing the mark into the imaging area, detecting the mark at plural points while moving the mark within the imaging area by a predetermined angle by rotating the susceptor, and calibrating an origin position of the coordinates in accordance with a rotation center calculated in accordance with the plural points.

According to this aspect, the axis direction and the origin position of the reference coordinates can be calibrated separately by using the susceptor that can rotate the substrate and the substrate transferring apparatus that can horizontally move the substrate and is provided independently of the susceptor, so that the coordinates arrangement of the imaging area of the imaging component can be easily and precisely adjusted even if there is an installation error of the imaging component, without re-installing the imaging component. With this, the substrate position can be precisely detected.

According to another aspect of the present invention, there is an imaging component position adjustment method according to the first aspect, wherein the substrate transferring apparatus is configured so that the supporting pin may be driven in an X direction and a Y direction, wherein, in calibrating the axis direction, the mark is detected at first plural points while moving the mark in the X direction within the imaging area by a predetermined distance by driving the supporting pin in the X direction, thereby matching an X direction of the coordinates with a direction in which the first plural points are arranged; and the mark is detected at second plural points while moving the mark in the Y direction within the imaging area by a predetermined distance by driving the supporting pin in the Y direction, thereby matching a Y direction of the coordinates with a direction in which the second plural points are arranged.

With this, because the X-axis direction and the Y-axis direction of the reference coordinates can be calibrated separately, either one of the X-axis direction and the Y-axis direction may be first calibrated. In addition, the X-axis direction and the Y-axis direction can be calibrated more easily and precisely than a case where the X-axis direction and the Y-axis direction are calibrated at the same time.

According to a third aspect of the present invention, there is provided an imaging component position adjustment method according to the first aspect, wherein the substrate position detection apparatus includes plural of the imaging components, wherein the plural imaging components are arranged apart from each other along and above the circumferential portion of the substrate, wherein the mark-equipped wafer includes plural marks whose number is more than or equal to the number of the plural imaging components, and wherein the plural marks are arranged in the mark-equipped wafer so that the imaging components may observe at least one of the plural marks.

With this, because the mark can be detected by the plural imaging components at the same time, an operating efficiency in calibrating the axis direction of the reference coordinates can be improved and an operating time can be shortened.

According to a fourth aspect of the present invention, there is provided an imaging component position adjustment method according to the first aspect, wherein the substrate position detection apparatus includes plural imaging components, wherein the plural imaging components are arranged apart from each other along and above the circumferential portion of the substrate, wherein, in calibrating the origin position of the coordinates, the mark is brought into plural imaging areas corresponding to the plural imaging components in turn by rotating the mark-equipped wafer, and wherein the same mark is detected at plural points in each of the plural imaging areas.

With this, displacement of the rotation center position, which may be caused by variations of a mark position in the mark-equipped wafer, is prevented, compared with a case where different marks are brought into different imaging areas of the corresponding imaging components and these marks are detected.

According to a fifth aspect of the present invention, there is provided an imaging component position adjustment method according to the third aspect, wherein the mark-equipped wafer includes plural of the marks to be used in calibrating the axis direction of the coordinates, and wherein one of the plural marks is used also in calibrating the origin position of the coordinates.

According to a sixth aspect of the present invention, there is provided an imaging component position adjustment method according to the first aspect, wherein the height adjustment jig includes plural through-holes, wherein the height adjustment jig is attached on the susceptor by inserting first plural pins arranged in the susceptor into lower portions of the corresponding plural through-holes, and wherein the mark-equipped wafer is attached on the height adjustment jig by inserting second plural pins that penetrate through the mark-equipped wafer into upper portions of the corresponding plural through-holes.

With this, because the susceptor and the mark-equipped wafer can be positioned using the same through-holes, the center position of the susceptor and the center position of the mark-equipped wafer can accurately coincide with each other.

According to a seventh aspect of the present invention, there is provided a substrate position detection apparatus that detects a position of a substrate in accordance with an image taken of a circumferential portion of the substrate by an imaging component, the substrate position detection apparatus being arranged in a vicinity of a rotatable susceptor on which the substrate is placed and a substrate transferring apparatus that is prepared separately from the susceptor and configured to drive a supporting pin for transferring the substrate to and/or from the susceptor in an X direction and a Y direction. The substrate position detection apparatus includes an imaging area of the imaging component in a substrate imaging plane, wherein an arrangement of coordinates of the imaging is adjusted by a step of supporting a mark-equipped wafer in which a mark is arranged corresponding to the circumferential portion of the substrate at a predetermined height above the susceptor by the supporting pin, detecting the mark at first plural points while moving the mark in the X direction within the imaging area by a predetermined distance by driving the supporting pin in the X direction, detecting the mark at second plural points while moving the mark in the Y direction within the imaging area by a predetermined distance by driving the supporting pin in the Y direction, calibrating an X-axis direction of the coordinates in accordance with the first plural points; and calibrating a Y-axis direction of the coordinates in accordance with the second plural points; and a step of maintaining the mark-equipped wafer with a height adjustment jig at the predetermined height above the susceptor, detecting the mark at third plural points while moving the mark within the imaging area by a predetermined angle by rotating the susceptor, and calibrating an origin position of the coordinates in accordance with a rotation center calculated in accordance with the third plural points.

According to an eighth aspect of the present invention, there is provided an imaging component position adjustment method for adjusting an arrangement of coordinates in an imaging area of an imaging component in a substrate imaging plane in a substrate position detection apparatus that detects a position of a substrate in accordance with an image taken of a circumferential portion of the substrate by the imaging component, the substrate position detection apparatus being arranged in a vicinity of a rotatable susceptor on which the substrate is placed and a substrate transferring apparatus that is prepared separately from the susceptor and configured to drive a supporting pin for transferring the substrate to and/or from the susceptor in an X direction and a Y direction. The imaging component position adjustment method includes steps of: supporting a mark-equipped wafer in which a mark is arranged corresponding to the circumferential portion of the substrate at a predetermined height above the susceptor by the supporting pin, detecting the mark at first plural points while moving the mark in the X direction within the imaging area by a predetermined distance by driving the supporting pin in the X direction, detecting the mark at second plural points while moving the mark in the Y direction within the imaging area by a predetermined distance by driving the supporting pin in the Y direction, calibrating an X-axis direction of the coordinates in accordance with the first plural points; and calibrating a Y-axis direction of the coordinates in accordance with the second plural points; and maintaining the mark-equipped wafer with a height adjustment jig at the predetermined height above the susceptor, detecting the mark at third plural points while moving the mark within the imaging area by a predetermined angle by rotating the susceptor, and calibrating an origin position of the coordinates in accordance with a rotation center calculated in accordance with the third plural points.

Effects of the Invention

According to the present invention, there are provided a substrate position detection apparatus and a method of adjusting a position of an imaging component of the same that are capable of adjusting the coordinate position of the imaging component in a simple manner and thus precisely detecting a substrate position.

Figure 1:
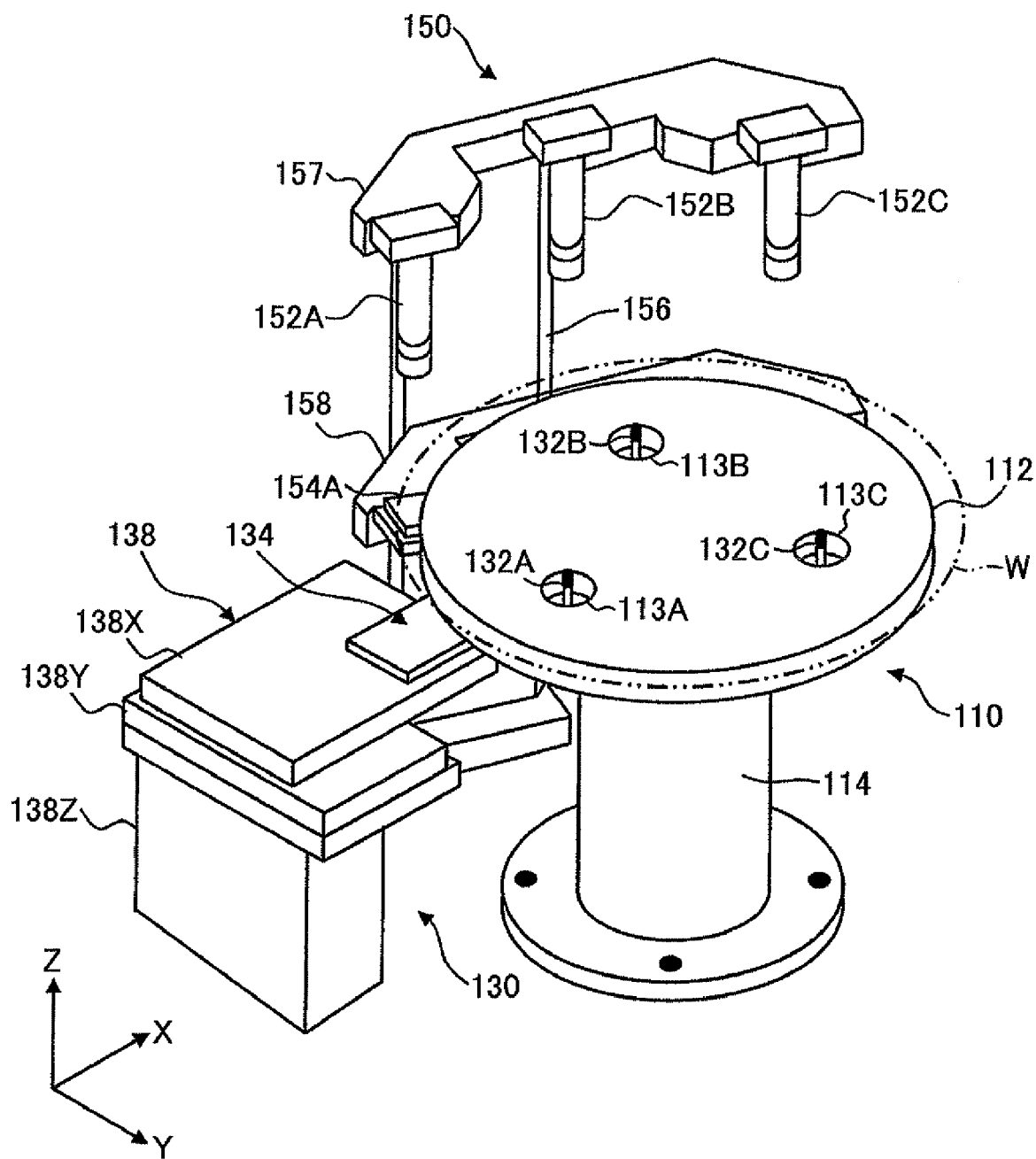
FIG. 1 is a perspective view for explaining a substrate transferring apparatus, a substrate position detection apparatus, and a susceptor unit.

DESCRIPTION OF THE REFERENCE NUMERALS 110 susceptor unit
112 susceptor
113A through 113C through-holes
114 supporting shaft
115H positioning hole
130 substrate transferring apparatus
132A through 132C supporting pins
134 base
135 attachment plate
136 supporting plate
138 supporting pin driving mechanism
138X X direction driving mechanism
138Y Y direction driving mechanism
138Z Z direction driving mechanism
150 substrate position detection apparatus
152A through 152C first through third imaging components
153A through 153C first through third measurement visual fields (imaging areas)
154A through 154C lighting sources
156 attachment pedestal
157, 158 bracket
200 control portion

MODE(S) FOR CARRYING OUT THE INVENTION

Referring to the accompanying drawings, there are described an example of a position adjustment method, and a substrate transferring apparatus, a substrate position detection apparatus and a susceptor unit, which are preferable to carry out the method, according to an embodiment of the present invention. In all the drawings, the same or corresponding reference marks are given to the same or corresponding members or components, and repetition of explanation is omitted. In addition, there is no intention to indicate relative proportions among the members or components. Therefore, the specific dimensions should be determined by a person having ordinary skill in the art in view of the following non-limiting embodiments.

(Example of an Apparatus Configuration)

Figure 2:
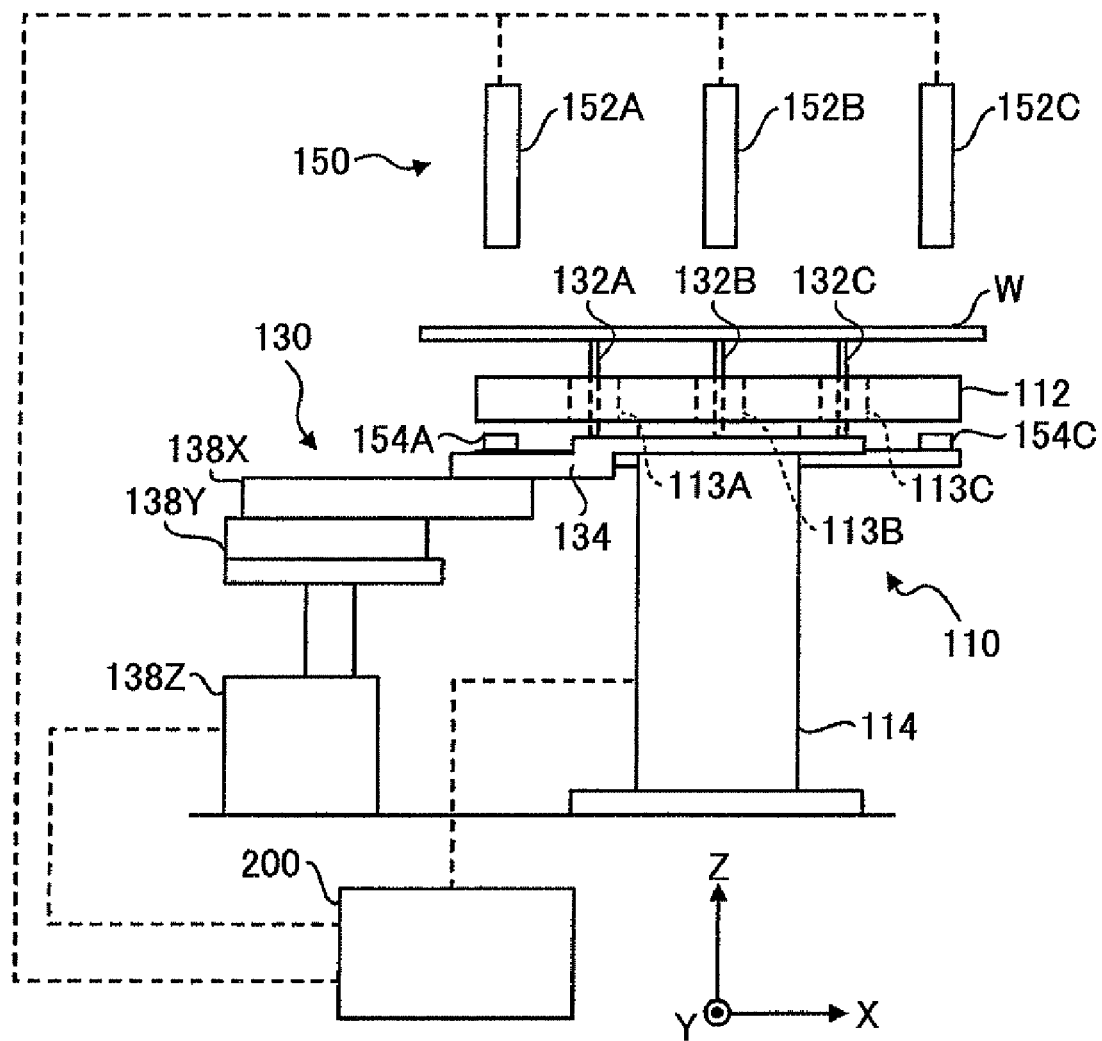
FIG. 2 is a side view of the apparatuses shown in FIG. 1.

A substrate position detection apparatus that allows an image component position adjustment method according to an embodiment of the present invention is described with reference to the drawings. FIG. 1 is a perspective view for explaining each component, and FIG. 2 is a side view of the components shown in FIG. 1. As shown in FIGS. 1 and 2, a substrate transferring apparatus 130 that transfers the wafer W between the susceptor 112 and a transfer arm (not shown) r and a substrate position detection apparatus 150 for detecting a horizontal position (in the X and Y directions) of the wafer W are arranged in the vicinity of a susceptor unit 110 including a rotatable susceptor 112 on which a substrate, for example, a semiconductor wafer (referred to as a wafer hereinafter) W is placed. The substrate transferring apparatus 130 is configured to be movable in the vertical direction and the horizontal (the X and Y) directions. A specific configuration of the substrate transferring apparatus 130 is described later.

The susceptor 112 is shaped into a disk having a diameter, for example, smaller than the diameter of the wafer W, as shown in FIG. 1. The wafer W is placed on the upper surface of the susceptor 112. The susceptor 112 is attached via a supporting shaft 114 on the bottom surface of a process chamber with a fastening member such as a bolt. In addition, a stepping motor (not shown) for rotating the susceptor 112 is provided inside the supporting shaft 114. The susceptor 112 may hold the wafer W, for example, by suction on the upper surface of the susceptor 12 through a vacuum chuck function. With this, even when the susceptor 112 is rotated at a high speed, the wafer W is prevented from falling off from the susceptor 112. The susceptor unit 110 is connected to a control portion 200 as shown in FIG. 2, which enables the susceptor to rotate in accordance with a control signal from the control portion 200.

(Substrate Transferring Apparatus)

Figure 3:
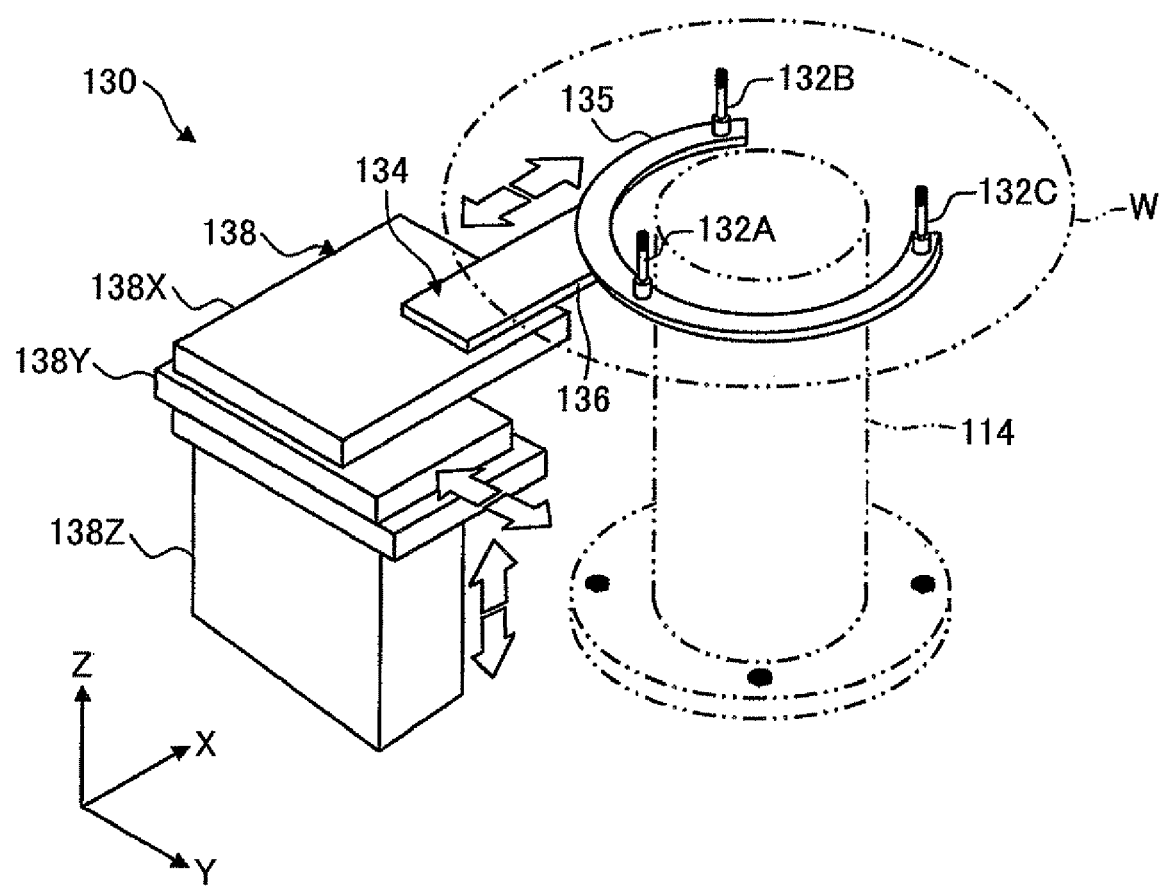
FIG. 3 is a schematic perspective view illustrating a configuration of the substrate transferring apparatus shown in FIG. 1.

Referring to FIGS. 1 and 3, the substrate transferring apparatus 130 is explained. FIG. 3 is a schematic perspective view illustrating the substrate transferring apparatus 130, in which the supporting shaft 114 of the susceptor 112 is illustrated with a two-dot chain line in order to clearly illustrating a substrate transferring apparatus configuration.

As shown in FIG. 3, the substrate transferring apparatus 130 includes plural (e.g., three) supporting (lifter) pins 132 (132A through 132C) that support the wafer W when the wafer W is transferred between the transfer arm (not shown) and the susceptor 112. These supporting pins 132A through 132C are arranged at predetermined intervals with respect to and around the supporting shaft 114 of the susceptor 112, as shown in FIG. 3. The supporting pins 132A through 132C are preferably arranged, for example, at equal intervals around the supporting shaft 114 so that the wafer W is stably supported. In addition, the number of the supporting pins 132 is not limited to the three, but at least three or more supporting pins 132 may preferably be provided so that the wafer W is stably supported.

The supporting pins 132A through 132C stand substantially upright at predetermined intervals (e.g., equal intervals) on an attachment plate 135 having a C-shape. The attachment plate 135 forms a base (lifter base) 134 along with a supporting plate 136 that supports the attachment plate 135. The supporting plate 136 is attached on a stage that constitutes an X-direction driving portion 138X of a supporting pin driving mechanism 138 (described later). When the stage is driven, the supporting pins 132A through 132C can be moved vertically or horizontally in unison by the base 134.

The C-shaped opening of the attachment plate 135 is larger than the diameter of the supporting shaft 114. Therefore, the attachment plate 135 allows the supporting shaft 114 to enter the C-shaped opening so that the supporting pins 132A through 132C are positioned around the supporting shaft 14.

The base 134 is attached on the supporting pin driving mechanism 138, which allows the supporting pins 132A through 132C to be driven vertically and horizontally. Specifically, the supporting pin driving mechanism 138 includes an X-direction driving portion 138X that can drive the supporting pins 132A through 132C in the X-direction, and a Y-direction driving portion 138Y that can drive the supporting pins 132A through 132C in the Y-direction, via the base 134. The X-direction driving portion 138X may be configured with, for example, a stage that is linearly movable in the X-direction, and the Y-direction driving portion 138Y may be configured with, for example, a stage that is linearly movable in the Y-direction. The X-direction driving portion 138X and the Y-direction driving portion 138Y constitute a horizontal (an X and Y direction) driving portion.

In addition, the supporting pin driving mechanism 138 includes a Z-direction driving portion 138Z that can drive the supporting pins 132A through 132C vertically (in the Z-direction) via the base 134. The Z-direction driving portion 138Z may be configured so that the X-direction driving portion 138X and the Y-direction driving portion 138Y can be vertically moved by, for example, a linearly movable stage.

Actuators for these driving portions 138X, 138Y, 138Z may be, for example, linear actuators. The linear actuators can provide a repetition positioning accuracy of several micrometers or less, and move each stage at a high speed. Instead of the linear actuators, a mechanism made by combining a ball screw and a stepping motor may drive each stage. The substrate transferring apparatus 130 is connected to the control portion 200 as shown in FIG. 2, and the driving portions 138X, 138Y, 138Z are controlled in accordance with control signals from the control portion 200.

According to the supporting pin driving mechanism 138 so configured, the Z-direction driving portion 138Z vertically drives the supporting pins 132A through 132C via the base 134, so that the wafer W can be moved up or down with respect to the transfer arm or the susceptor 112. In addition, the X-direction driving portion 138X and the Y-direction driving portion 138Y drive the supporting pins 132A through 132C via the base 134 horizontally (in the X and Y directions), so that a horizontal position of the wafer W on the supporting pins 132A through 132C can be adjusted.

With this, after the supporting pins 132A through 132C receive the wafer W from the transfer arm, the supporting pins 132A through 132C can horizontally move the wafer W, which can correct displacement of the wafer W while supporting the wafer W on the supporting pins 132A through 132C, without using the transfer arm or a transfer robot. As a result, wafer processes throughput can be improved.

When a wafer having a relatively large diameter is placed on and brought up from the susceptor 112, through-holes 113A through 113C are preferably formed corresponding to the supporting pins 132A through 132C in the susceptor 112. In this case, the supporting pins 132A through 132C can be moved up from or down below the upper surface of the susceptor 112 through the corresponding through-holes 113A through 113C by being driven by the Z-direction driving portion 138Z via the base 134.

In addition, the supporting pins 132A through 132C are driven by the X-direction driving portion 138X and the Y-direction driving portion 138Y via the base 134, so that the supporting pins 132A through 132C can move horizontally (in the X and Y directions) within the corresponding supporting pins 132A through 132C and in ranges corresponding to the inner diameters of the corresponding supporting pins 132A through 132C.

According to such a configuration, because the wafer W is supported at positions close to the center of the wafer W rather than the circumferential portion of the wafer W by the supporting pins 132A through 132C, when the circumferential portion of the wafer W is subjected to a certain process (for example, a cleaning process described later), the wafer W can be supported at positions apart from the portion subjected to the process.

A diameter of the through-holes 113A through 113C may be determined in accordance with a diameter of the supporting pins 132A through 132C and a horizontal traveling distance (i.e., a feasible range of horizontal positioning) of the supporting pins 132A through 132C. For example, the diameter of the through-holes 113A through 113C may be from 10 mm to 20 mm.

When the susceptor 112 is rotated, the supporting pins 132A through 132C are lowered so that upper ends of the supporting pins 132A through 132C are lower than the surface of the susceptor 112. With this, the supporting pins 132A through 132C are prevented from hitting the inner wall of the through-holes 113A through 113C when the susceptor 112 is rotated.

In addition, while one supporting pin goes through one through-hole made in the susceptor in this embodiment, plural supporting pins may go through one of plural through-holes when plural supporting pins are used.

In the substrate transferring apparatus 130 so configured, because the supporting pins 132A through 132C are configured to be movable horizontally (in the X and Y directions), once the supporting pins 132A through 132C receive the wafer W from the transfer arm, the supporting pins 132A through 132C rather than the transfer arm can horizontally move the wafer W while supporting the wafer W. With this, displacement of the wafer W can be readily corrected. In addition, the transfer arm can proceed to the next operation (e.g., transferring another wafer) after the transfer arm transfers the wafer W to the supporting pins 132A through 132C, so that the wafer processes throughput can be improved.

Moreover, because the substrate transferring apparatus 130 according to this embodiment is configured differently from the susceptor unit 110, the substrate transferring apparatus 130 may have a simple configuration. Furthermore, because the substrate transferring apparatus 130 can provide a high degree of freedom when being arranged in a process chamber, the substrate transferring apparatus 130 can be provided in various process chambers. Additionally, the susceptor 112 can be rotated at a high speed, when being rotated, because the susceptor unit 110 is configured differently from the substrate transferring apparatus 130. Moreover, because the substrate transferring apparatus 130 can horizontally drive the supporting pins 132A through 132C by the X-direction driving portion 138X and the Y-direction driving portion 138Y, displacement of the wafer W can be precisely corrected.

Moreover, regarding the substrate transferring apparatus 130 according to this embodiment, because displacement of the wafer W is corrected by horizontally driving the supporting pins 132A through 132C rather than the susceptor 134, even when the displacement is so large that the substrate position detection apparatus 150 cannot detect the displacement, the wafer W can be horizontally moved into a position that allows the substrate position detection apparatus 150 to detect the displacement by the supporting pins 132A through 132C with the wafer W supported by the supporting pins 132A through 132C. With this, even when the wafer W is largely displaced, the position of the wafer W can be detected and the displacement is readily corrected.

(Substrate Position Detection Apparatus)

Figure 4:
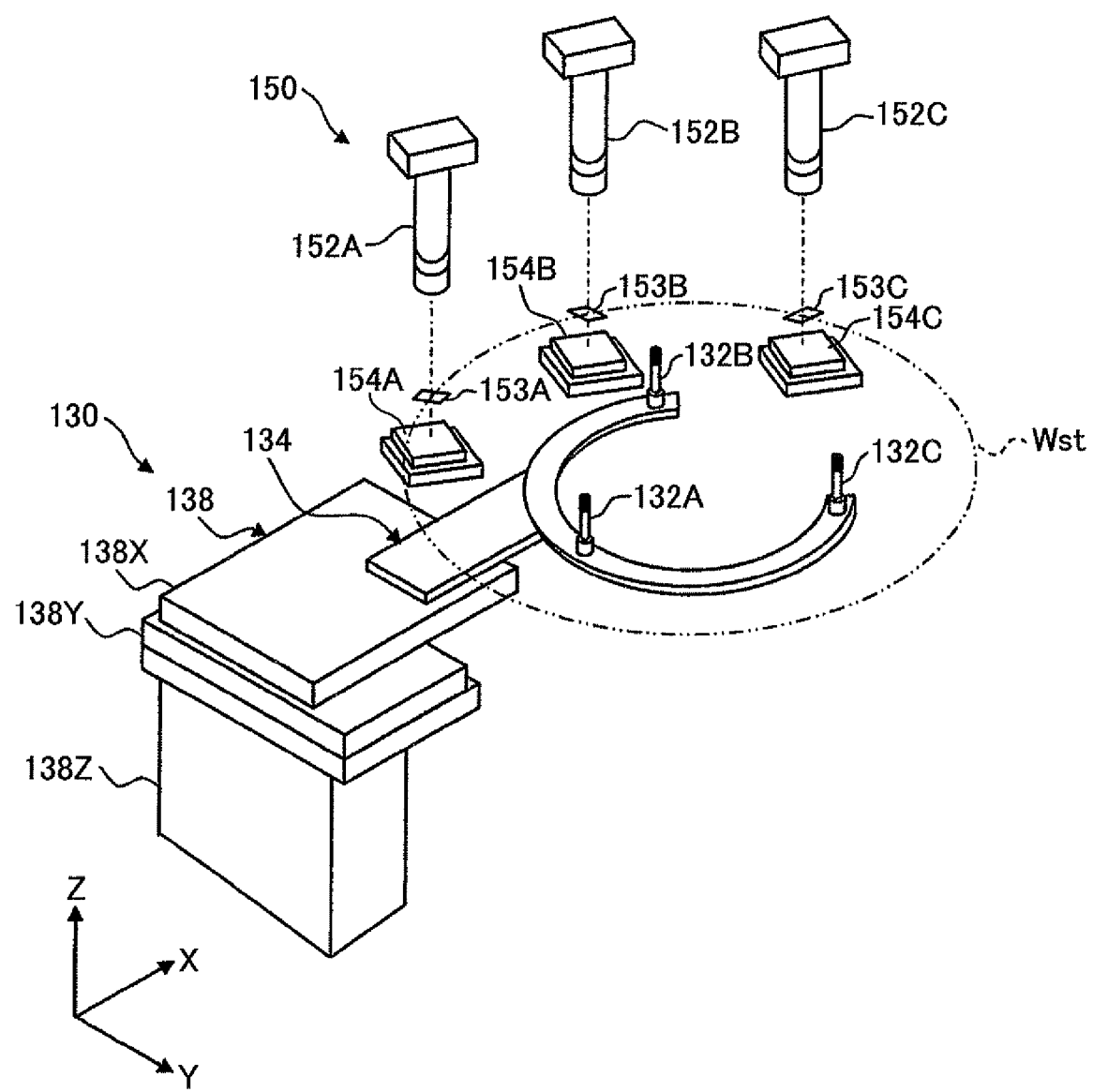
FIG. 4 is a schematic perspective view illustrating a configuration of the substrate position detection apparatus shown in FIG. 1.

Next, referring to FIGS. 1 and 4, the substrate position detection apparatus 150 is explained. FIG. 4 is a schematic perspective view showing a configuration of the substrate position detection apparatus 150, in which an attachment pedestal 156 and the susceptor unit 110 shown in FIG. 1 are omitted in order to clearly illustrate the configuration of the substrate position detection apparatus 150.

The substrate position detection apparatus 150 includes a substrate position detection portion for detecting a horizontal position of the wafer W. The substrate position detection portion includes plural (e.g., three) imaging components (first through third imaging components) 152A through 152C that detect a circumferential portion of the wafer W, and lighting sources 154A through 154C that are arranged opposing the corresponding imaging components 152A through 152C.

The imaging components 152A through 152C detect presence/absence of the wafer W, presence/absence of the circumferential portion of the wafer W, and a shape of the circumferential portion. The shape of the circumferential portion of the wafer W is used, for example, in such a way that the center of the wafer W is obtained from the circumferential shape and thus a position of the wafer W is detected. The presence/absence of the circumferential portion of the wafer W is used, for example, to determine whether the circumferential portion of the wafer W can be detected. The presence/absence of the wafer W is used, for example, to correct the position of the wafer W to a position that enables the detection of the circumferential portion of the wafer W.

In this embodiment, the imaging components 152A through 152C are configured with CCD cameras (imaging apparatuses). Each of the CCD cameras includes a CCD (Charge Coupled Device) image sensor, a focus lens, and the like. In addition, the lighting sources 154A through 154C include light diffusing plates as light emitting planes, thereby making the light intensity uniform across the light emitting planes.

The imaging components 152A through 152C and the lighting sources 154A through 154C are attached, for example, on the attachment pedestal 156 that stands upright as shown in FIG. 1. The attachment pedestal 156 includes a bracket 157 horizontally extending from the top portion of the attachment pedestal 156, and a bracket 158 horizontally extending below the bracket 157. The imaging components 152A through 152C are attached on the upper bracket 157, and the lighting sources 154A through 154C are attached on the lower bracket 158. With this, the imaging components 152A through 152C are positioned above the circumferential portion of the wafer W, and the lighting sources 154A through 154C are positioned below the circumferential portion of the wafer W.

As shown in FIG. 4, the lighting sources 154A through 154C are arranged so that the optical axes of the lighting sources 154A through 154C go through light receiving surfaces of the corresponding imaging components 152A through 152C. In addition, when it is assumed that the supporting pins 132A through 132C are raised above the upper surface of the susceptor 112 in order to receive the wafer W at a receiving height, and that the center of the wafer W and the center of the susceptor coincide with each other at a reference position Wst in horizontal directions (a position of the wafer shown by a two-dot line in FIG. 4), the imaging components 152A through 152C are adjusted so that focus is brought on the circumferential portion of the wafer W positioned in the reference position Wst at the receiving height. Moreover, the imaging components 152A through 152C are adjusted so that the circumferential portion of the wafer W positioned in the reference position Wst at the receiving height is brought into measurement visual fields (first through third measurement visual fields) 153A through 153C as imaging areas of the imaging components 152A through 152C. Such adjustments are carried out in accordance with a later-described imaging component position adjustment method, in this embodiment.

Figure 5:
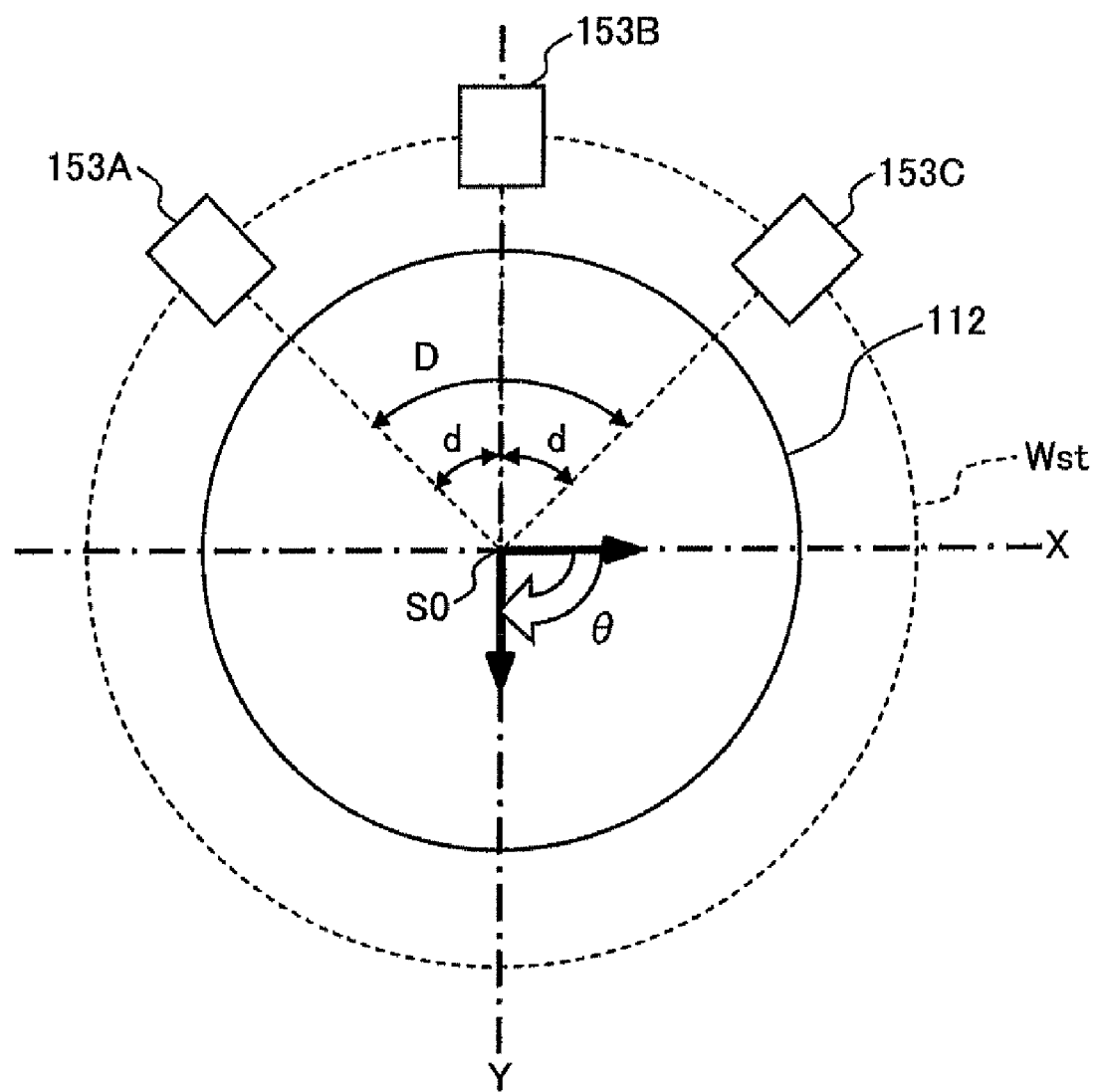
FIG. 5 is an explanatory view for explaining a relationship between measurement visual fields of imaging components of the substrate position detection apparatus and design-based reference coordinates.
Figure 6:
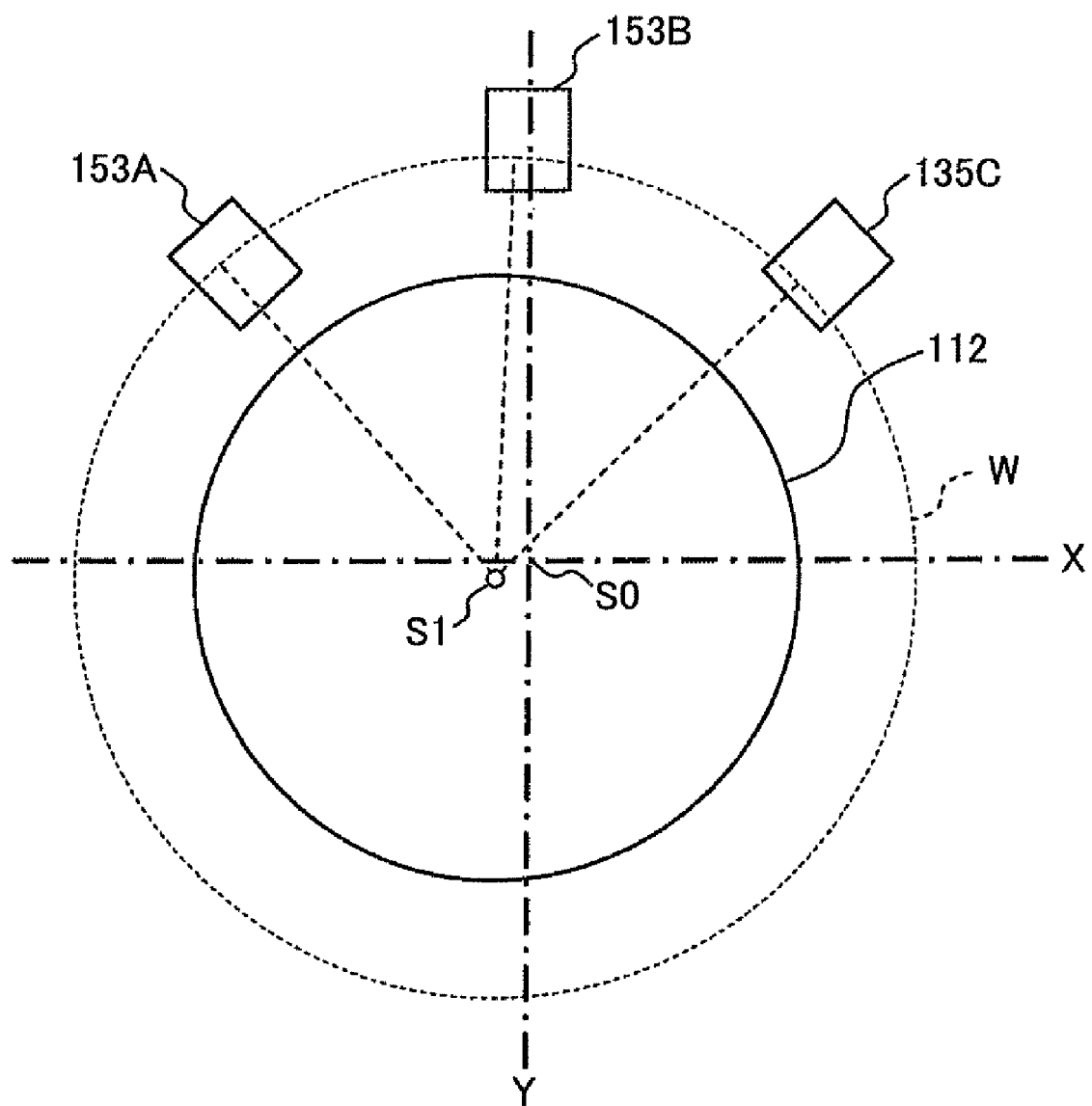
FIG. 6 is an explanatory view for explaining displacement of the measurement visual fields on the reference coordinates.

Specifically, the measurement visual fields 153A through 153C of the corresponding imaging components 152A through 152C are arranged along the circumferential portion of the wafer W positioned in the reference position Wst, as shown in FIG. 5. In the illustrated example, an angle d defined by the measurement visual field 153A, a center S0 of the wafer W positioned in the reference position Wst and the measurement visual field 153B, and an angle d defined by the measurement visual field 153B, the center S0 of the wafer W positioned in the reference position Wst, and the measurement visual field 153C are 45°. An angle D defined by the measurement visual field 153A, the center S0 of the wafer W positioned in the reference position Wst, and the measurement visual field 153C is 90°. An arrangement of the measurement visual fields 153A through 153C is not necessarily limited to the above-mentioned arrangement, but may be changed by adjusting the installation position of the imaging components 152A through 152C. An angle θ in the X-Y coordinates shown in FIG. 5 is measured in a clockwise direction from the X-axis as the origin.

As shown in FIG. 2, the imaging components 152A through 152C are connected to the control portion 200 that controls each portion including the substrate transferring apparatus 130 and the like. Image data of the image taken in the measurement visual fields 153A through 153C by the corresponding imaging components 152A through 152C are transmitted to the control portion 200. The control portion 200 detects the circumferential portion of the wafer W in accordance with the image data.

For example, when the circumferential portion of the wafer W is brought into the measurement visual field 153A, an area corresponding to the wafer W in the measurement visual field 153A becomes darker because the light from the lighting source 154 is blocked by the wafer W, and the other area is bright. Therefore, presence/absence of the circumferential portion of the wafer W can be easily detected in the measurement visual field 153A. When the circumferential portion exists in the measurement visual field, this visual field is referred to as a gray visual field, which is distinguished from a white visual field where the entire measurement visual field is bright because no circumferential portion is in the measurement visual field and a black visual field where the entire measurement visual field is dark because the wafer W is blocking the measurement visual field, which is described later.

In addition, because a boundary between the bright area and the dark area in the measurement visual field 153A in the above example corresponds to the shape of the circumferential portion of the wafer W, which is, for example, an arc shape when a disc-like wafer is used in this embodiment, the shape of the circumferential portion of the wafer W can be detected from the image taken in the measurement visual field 153A.

Based on the shape of the circumferential portion of the wafer W detected in the above manner, the control portion 200 can calculate the center position of the wafer W. In addition, the control portion 200 can also obtain an amount of displacement of the wafer W in the horizontal direction with respect to the rotation center axis of the susceptor 112, and a direction of the displacement. Based on the amount and the direction of the displacement, the supporting pins 132A through 132C are driven in the horizontal directions by driving the X direction driving portion 138X and the Y direction driving portion 138Y so that the position of the wafer W in the horizontal directions is adjusted.

In order to detect the displacement of the wafer W with respect to the rotation center of the susceptor 112 in accordance with the image data obtained by the imaging components 152A through 152C, the positions of the measurement visual fields 153A through 153C corresponding to the imaging components 152A through 152C need to be accurately determined in advance on the reference coordinates (the XY coordinates) where the rotation center of the susceptor 112 is taken as the origin S0.

The X direction, the Y direction, and the origin position of the reference coordinates are determined in accordance with a design-based position of each apparatus. For example, the origin of the coordinates corresponds to the design-based rotation center of the susceptor 112; the X-axis of the reference coordinates corresponds to a design-based direction in which the X direction driving portion 138X of the substrate transferring apparatus 103 moves; and the Y-axis of the reference coordinates corresponds to a design-based direction in which the Y direction driving portion 138Y of the substrate transferring apparatus 103 moves.

In addition, the positions of the measurement visual fields 153A through 153C with respect to the origin of the reference coordinates are determined to be the corresponding positions of the corresponding measurement visual fields 153A through 153C with respect to the rotation center of the susceptor 112 on the reference coordinates, in accordance with the design-based installation position of the imaging components 152A through 152C.

However, the design-based origin S0 of the reference coordinates may be in disagreement with a real center position S1 of the susceptor 112 due to installation errors of the imaging components 152A through 152C. If there is displacement between the design-based origin S0 of the reference coordinates and the actual center position S1 of the susceptor 112 in the above manner, the positions of the measurement visual fields 153A through 153C are displaced with respect to the center position S1 of the susceptor 112. Such a displacement of the measurement visual fields 153A through 153C makes it impossible, depending on the degree of the displacement, to precisely detect the displacement of the center position of the wafer W with respect to the center position S1 of the susceptor 112.

In addition to the origin of the reference coordinates, the X-axis may be in disagreement with the driving direction of the X direction driving portion 138X and the Y-axis may be in disagreement with the driving direction of the Y direction driving portion 138Y due to the installation errors of the imaging components 152A through 152C. Under these situations, even if the displacement of the center position of the wafer W is precisely detected with respect to the center position S1 of the susceptor 112, it is not possible to precisely correct the position of the wafer W in the X-axis and the Y-axis directions. Therefore, the coordinate positions of the measurement visual fields 153A through 153C of the corresponding imaging components 152A through 152C are precisely adjusted in advance.

In this embodiment of the present invention, when the reference coordinates (the X-axis direction, the Y-axis direction, and the origin position) are determined for the measurement visual fields 153A through 153C of the corresponding imaging components 152A through 152C, a mark equipped wafer Wd, which is different from the wafer W, is used and the mark is detected, so that the X-axis direction, the Y-axis direction, and the origin position are calibrated in accordance with the detection result of the mark. In this manner, the coordinate positions of the measurement visual fields 153A through 153C on the reference coordinates are adjusted. With this, even if there are installation errors of the imaging components 152A through 152C, the center position of the wafer W with respect to the rotation center of the susceptor 112 can be accurately detected, and the position of the wafer W in the X and the Y directions can be accurately corrected.

It may be considered that the coordinate positions of the imaging components are calibrated by detecting a mark provided on the rotatable table if the rotatable table is configured to be movable in the X and the Y directions. However, when the table is moved in the X and the Y directions, the rotational center of the table is also moved, and when the table is rotated, the X and the Y directions are displaced. Therefore, complicated operations are inevitable in order to calibrate the coordinate positions of the imaging components in this case.

In contrast with this, because the wafer W can be moved in the X and the Y directions independently from the rotation of the susceptor 112 by the substrate transferring apparatus 130 configured differently from the rotatable susceptor 112, the X-axis and the Y-axis of the reference coordinates are calibrated independently from the calibration of the origin position. With this, the coordinate positions of the corresponding imaging components 153A through 153C can be adjusted with quite simple operations.

Specifically, the X-axis and the Y-axis of the reference coordinates are calibrated by setting the wafer Wd on the supporting pins 132A through 132C of the substrate transferring apparatus 130 and detecting the mark at plural points while actually moving the wafer Wd in the X and the Y directions. In addition, the origin position is calibrated by setting the wafer Wd on the susceptor 112 via a height adjustment jig 300 (described later) and detecting the mark at plural points while actually rotating the wafer Wd. Based on these measurement points of the mark, the X-axis direction, the Y-axis direction, and the origin position are calibrated, thereby adjusting the coordinate positions of the measurement visual fields 153A through 153C of the corresponding imaging components 152A through 152C.

(A Mark-Equipped Wafer)

Figure 7:
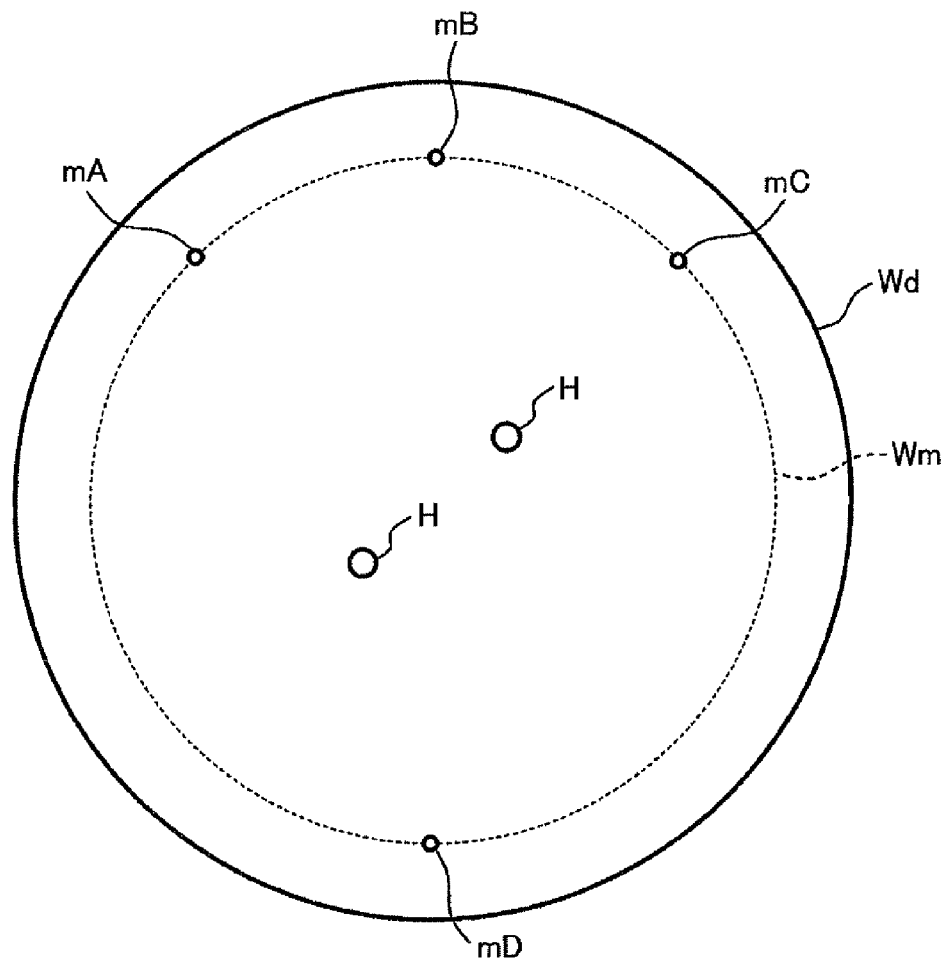
FIG. 7 shows an example of a mark-equipped wafer used in an embodiment of the present invention.

Next, an example of the mark-equipped wafer Wd is described with reference to the drawings. FIG. 7 shows an example of a configuration of the wafer Wd. As shown in FIG. 7, the wafer Wd has a diameter larger than the diameter of a wafer Wm that is used to fabricate semiconductor devices. When it is assumed that the actual wafer Wm is arranged in a concentric relationship with the wafer Wd, plural marks mA through mD are formed along a concentric circle on the wafer Wd, the concentric circle corresponding to the circumferential portion of the wafer Wm.

The marks mA through mD may be through-holes that penetrate through the wafer Wd. According to this, when the marks mA through mD are within the measurement visual fields 153A through 153C of the corresponding imaging components 152A through 152C, the marks mA through mD are detected as bright spots because the light from the lighting sources 154A through 154C passes through the marks (through-holes) mA through mD. When a weighted center of each of the detected bright spots is obtained, the positions of the weighted centers are detected as the positions of the corresponding marks mA through mD. The marks mA through mD are not limited to the through-holes, but may be indications having a different color from the color of the wafer Wd.

Among the marks mA through mD, the marks mA through mC serve as axis direction calibration marks to calibrate the X-axis and the Y-axis of the reference coordinates for the measurement visual fields 153A through 153C of the corresponding imaging components. The marks mA through mD correspond to the measurement visual fields 153A through 153C. Namely, the marks mA through mC are arranged so that the marks mA through mC can be detected at a time in the corresponding measurement visual fields 153A through 153C. With this, the X-axis direction and the Y-axis direction of the reference coordinates can be calibrated at a time in the measurement visual fields 153A through 153C. A method of calibrating the axis directions of the reference coordinates using the axis direction calibration marks mA through mD is described later.

In addition, the mark mD serves as an origin calibration mark to calibrate the origin of the reference coordinates for the imaging components 152A through 152C. A method of calibrating the origin position of the reference coordinates using the origin calibration mark mD is described later.

Moreover, the wafer Wd is provided with plural (e.g., two) positioning holes H that allow the wafer Wd to be attached and accurately positioned on the susceptor 112 by using the height adjusting jig 300, so that the rotation center of the susceptor 112 coincides with the center of the wafer Wd in calibrating the origin position of the reference coordinates. A specific method of attaching the wafer Wd on the susceptor 112 using the height adjusting jig 300 is described later.

(Method of Adjusting an Imaging Component Position)

Figure 8:
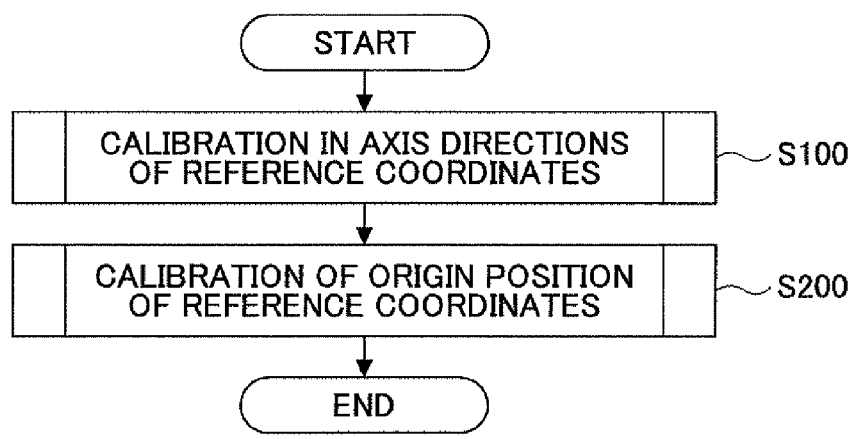
FIG. 8 is a flowchart illustrating a position adjustment method of the imaging components, according to the embodiment of the present invention.

Next, a method of adjusting the imaging component positions according to an embodiment of the present invention is described with reference to the drawings. With this method of adjusting the imaging component positions, the positions of the measurement visual fields 153A through 153C of the corresponding imaging components 152A through 152C of the substrate position detection apparatus 150, which are set on the reference coordinates (the XY coordinates), are adjusted using the above-mentioned substrate transferring apparatus 130 and the susceptor unit 110. FIG. 8 is a flowchart showing the method of adjusting the imaging component positions according to this embodiment.

The method of adjusting the imaging component positions according to this embodiment is composed of a process step (step S110) where the axis directions (the X-axis direction, the Y-axis direction) are calibrated by moving the wafer Wd in the horizontal directions (the XY directions) with the substrate transferring apparatus 130, and another process step (step S200) where the origin position of the reference coordinates is calibrated by rotating the wafer Wd with the susceptor 112. In the following, these process steps are described by turns.

(Calibration of the Axis Directions of the Reference Coordinates)

Figure 9:
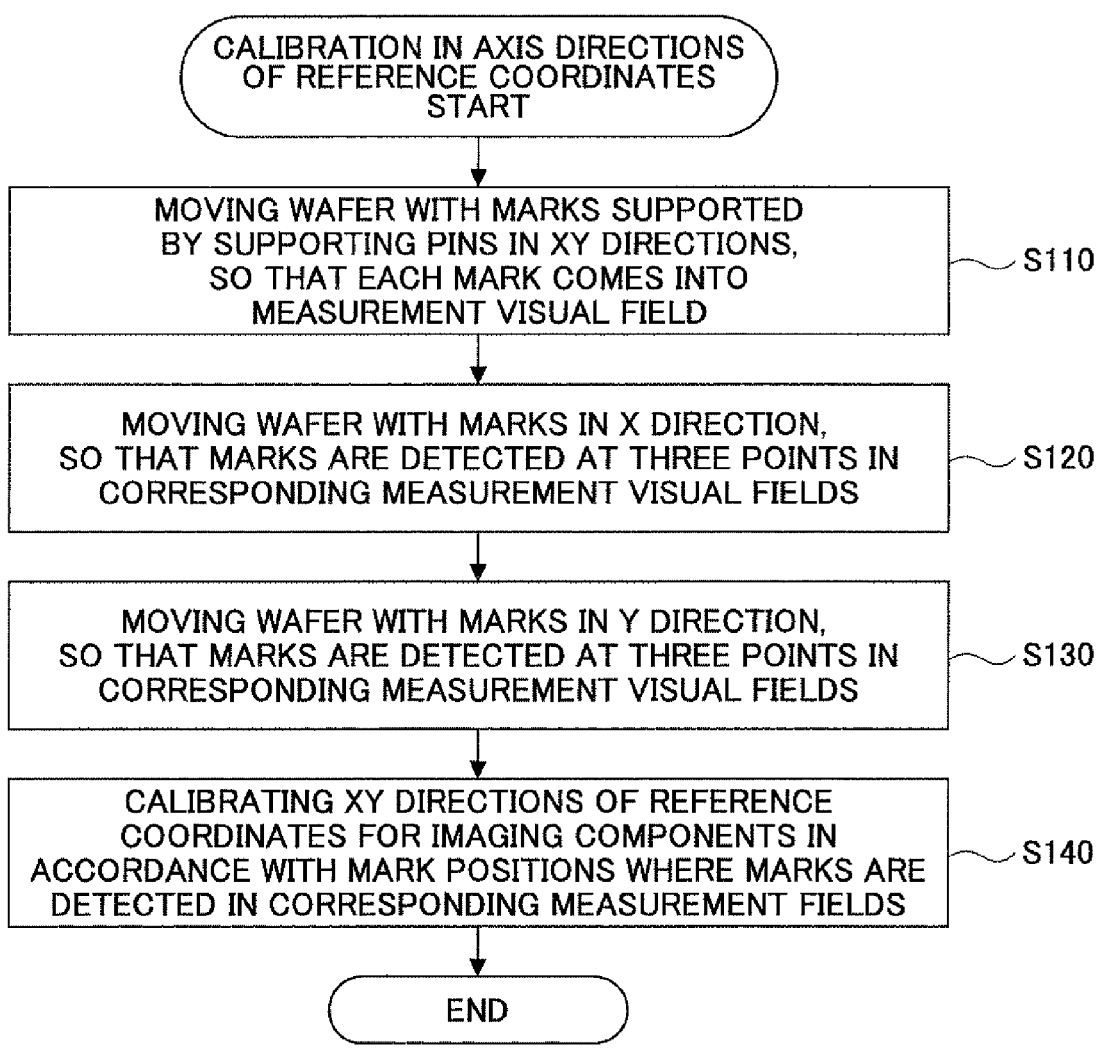
FIG. 9 is flowchart illustrating a specific example of calibration in the axis directions of the reference coordinates in the position adjustment method shown in FIG. 8.

First, the process step for calibrating the axis directions of the reference coordinates (step S100) is described with reference to the drawings. This axis direction calibration process step is carried out, for example, as shown in FIG. 9. As shown, the wafer Wd supported by the supporting pins 132A through 132C of the substrate transferring apparatus 130 is moved in the horizontal directions (the XY directions) so that the marks mA through mC of the wafer Wd enter the corresponding measurement visual fields 153A through 153C at step S110.

Figure 10:
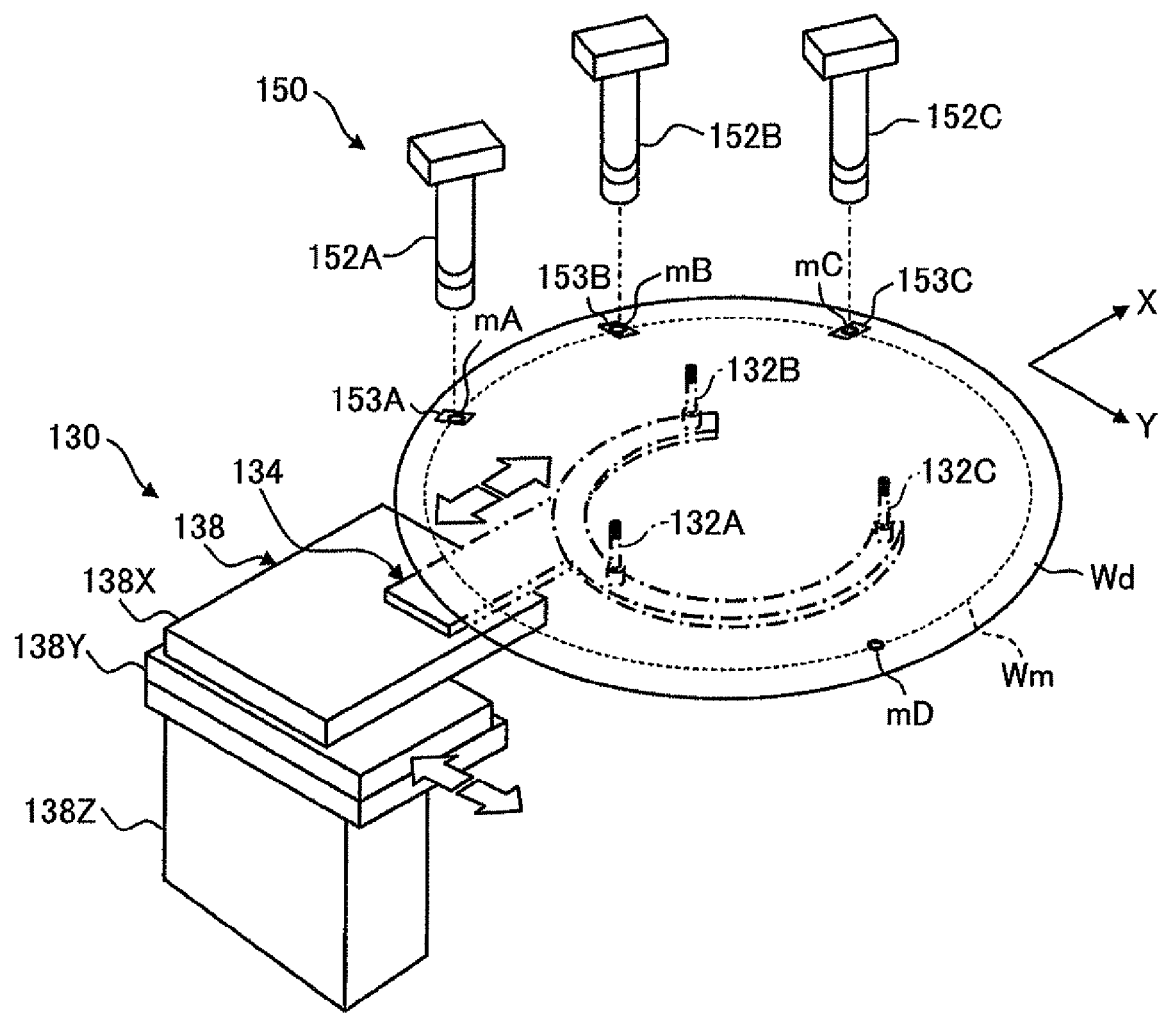
FIG. 10 is a perspective view of the mark-equipped wafer supported by supporting pins of the substrate transferring apparatus.
Figure 11:
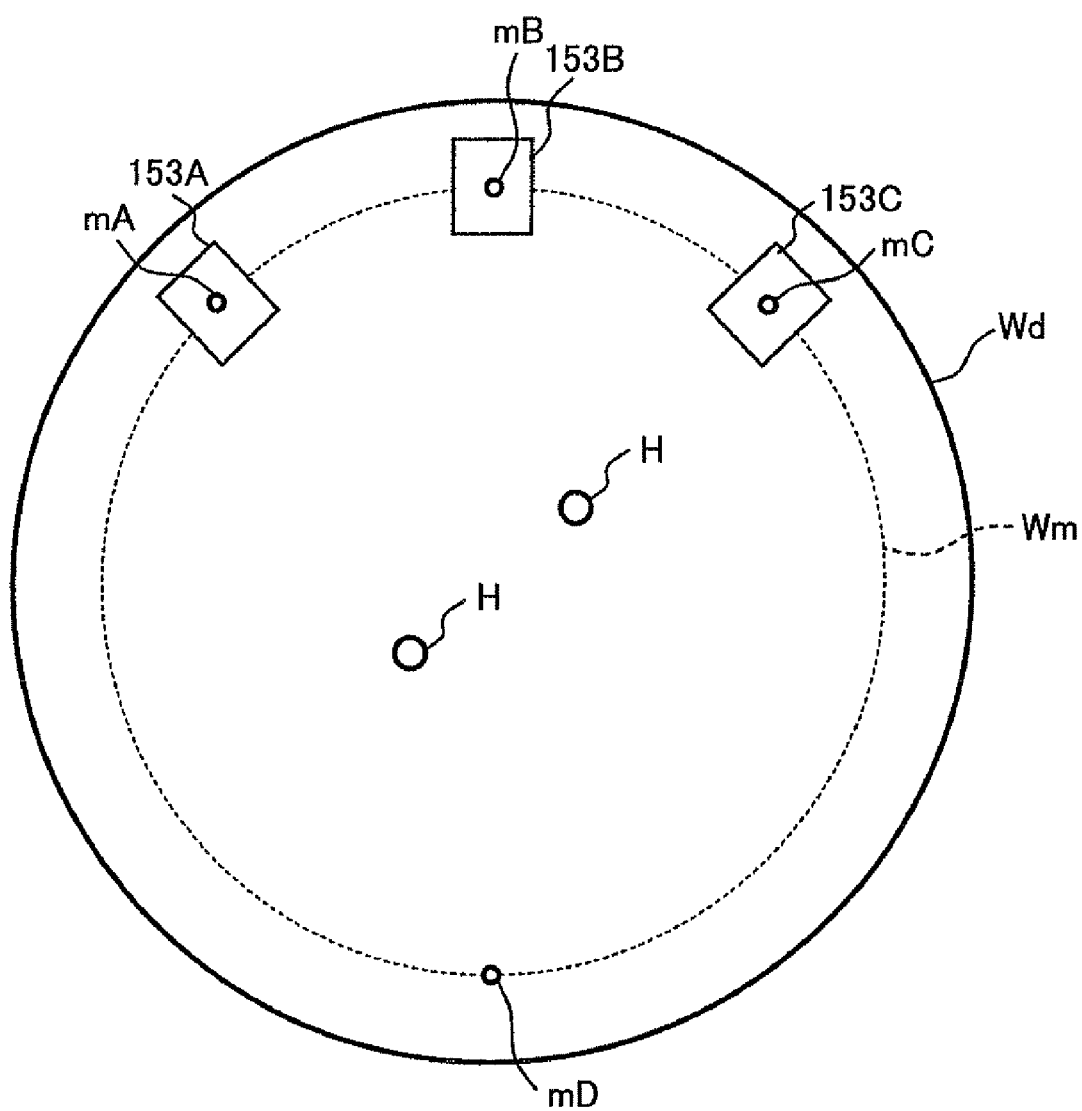
FIG. 11 shows a relationship between an axis direction calibration mark of the mark-equipped wafer and the measurement visual field of the imaging component, where the mark is brought into the corresponding measurement visual field.

Specifically, the wafer Wd is placed on the supporting pins 132A through 132C of the substrate transferring apparatus 130 as shown in FIG. 10. At this time, the supporting pins 132A through 132C are adjusted by the Z direction driving portion 138Z so that the wafer Wd is supported at a position where the actual wafer W position is detected. Then, the wafer Wd is moved in the X direction and the Y direction by driving the X direction driving portion 138X and the Y direction driving portion 138Y, respectively, so that the marks mA through mC of the wafer Wd are brought into the corresponding measurement visual fields 153A through 153C as shown in FIG. 11. At this moment, the focuses of the imaging components 152A through 152C are adjusted using the marks mA through mC.

Figure 12:
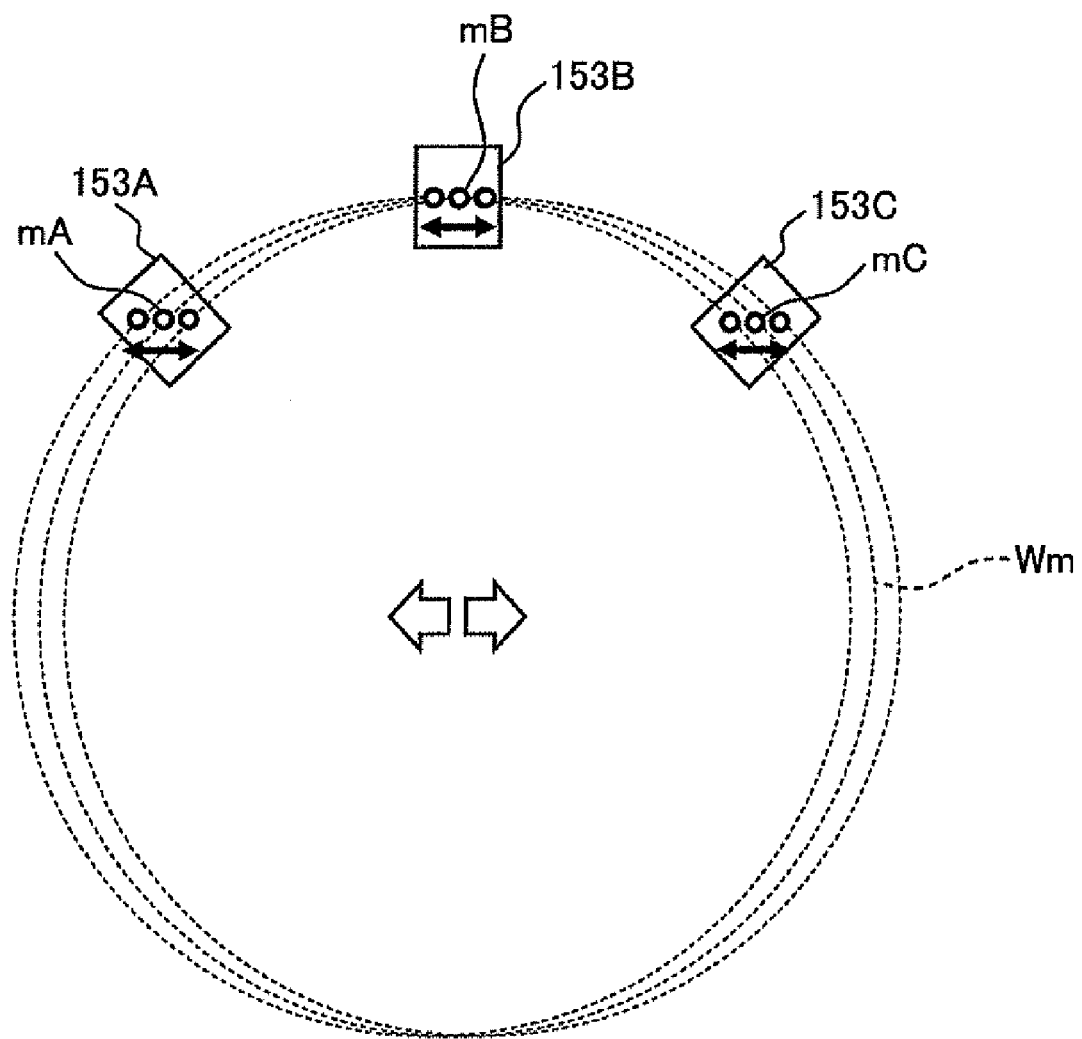
FIG. 12 shows a relationship between an axis direction calibration mark of the mark-equipped wafer and the measurement visual field of the imaging component, where the mark is moved in an X direction.

Next, the wafer Wd is moved in the X direction while the marks mA through mC are kept in the corresponding measurement visual fields 153A through 153C, and the marks mA through mC are detected at plural (e.g., three) different points in the corresponding measurement visual fields 153A through 153C at step S120. Specifically, the marks mA through mC are detected at corresponding first points (e.g., a center point of the three points in FIG. 12) in the corresponding measurement visual fields 153A through 153C.

The X direction driving portion 138X is driven to move the wafer Wd in the minus X direction (FIG. 10) by a predetermined distance, so that the marks mA through mC are detected at corresponding second points in the corresponding measurement visual fields 153A through 153C. Next, the wafer Wd is moved in the plus X direction by a predetermined distance, so that the marks mA through mC are detected at corresponding third points in the corresponding measurement visual fields 153A through 153C. These points are stored in a memory and the like.

Detecting the three measurement points of the marks mA through mC is not limited to the above. For example, plural measurement points of the marks mA through mC may be detected while moving the wafer Wd in one direction along the X-axis (the plus direction or the minus direction) by a predetermined distance.

Figure 13:
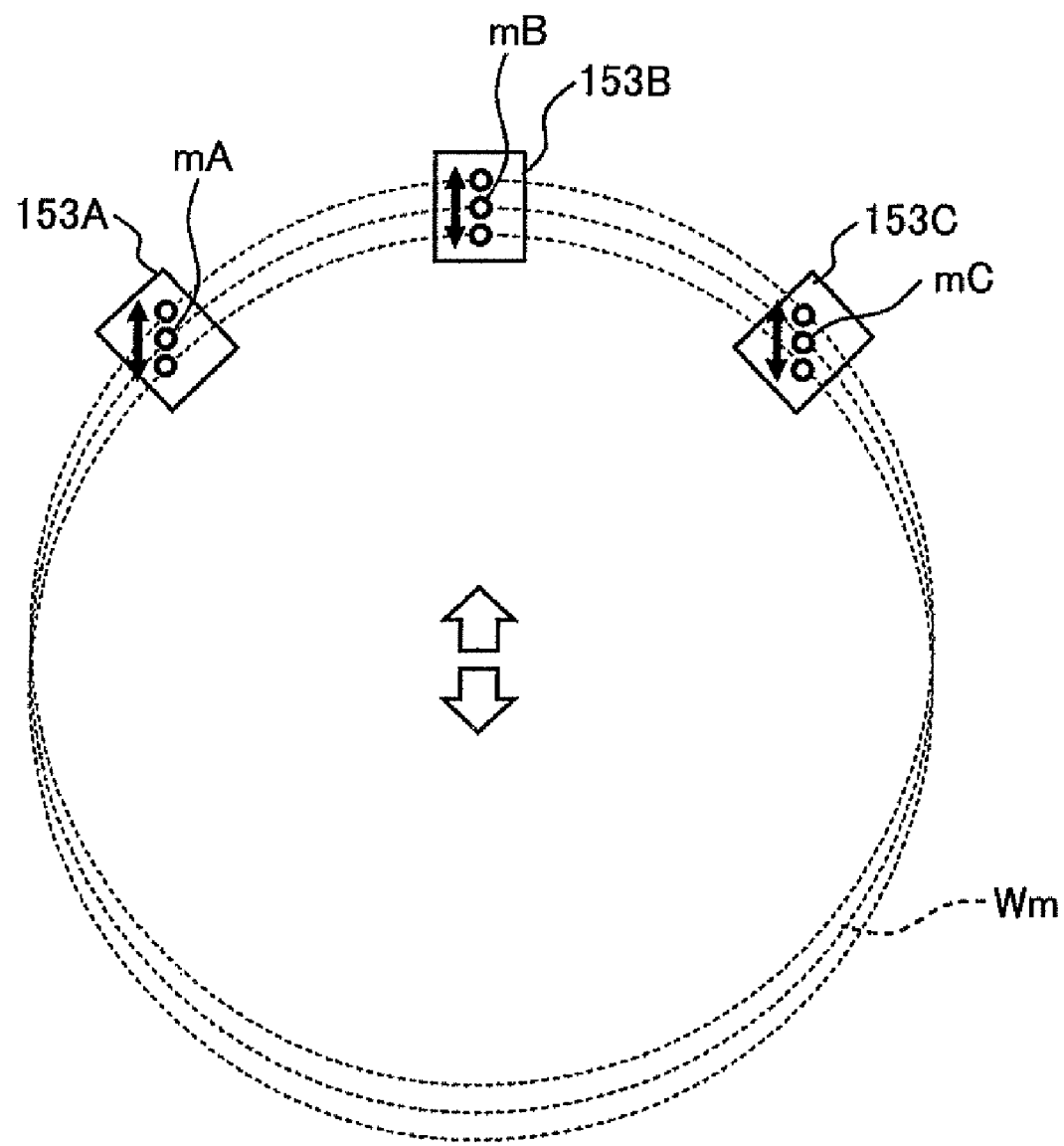
FIG. 13 shows a relationship between an axis direction calibration mark of the mark-equipped wafer and the measurement visual field of the imaging component, where the mark is moved in a Y direction.

Subsequently, the wafer Wd is moved in the Y direction while the marks mA through mC are kept in the corresponding measurement visual fields 153A through 153C, so that the marks mA through mC are detected at plural (e.g., three) different points at step S130. Specifically, the marks mA through mC are detected at corresponding first points (e.g., a center point of the three points in FIG. 13) in the corresponding measurement visual fields 153A through 153C.

The Y direction driving portion 138Y is driven to move the wafer Wd in the minus Y direction by a predetermined distance, so that the marks mA through mC are detected at corresponding second points in the corresponding measurement visual fields 153A through 153C. Next, the wafer Wd is moved in the plus Y direction by a predetermined distance, so that the marks mA through mC are detected at corresponding third points in the corresponding measurement visual fields 153A through 153C. These points are stored in a memory and the like.

According to the above, the marks mA through mC are readily detected at three measurement points along the X direction and the Y direction in the corresponding measurement visual fields 153A through 153C, thereby enhancing operating efficiency of the calibration process of the reference coordinates along the axes and shortening the operating time.

Detecting the three measurement points of the marks mA through mC along the Y-axis direction is not limited to the above. For example, plural measurement points of the marks mA through mC may be detected while moving the wafer Wd in one direction along the Y-axis (the plus direction or the minus direction) by a predetermined distance. In addition, after detecting the three measurement points along the Y-axis direction is carried out, detecting the three measurement points along the X-axis direction may be carried out.

Next, the axis directions of the reference coordinates for the imaging components 152A through 152C are calibrated in accordance with the detected measurement points of the marks mA through mC in the corresponding measurement visual fields 153A through 153C at step S140. Specifically, this calibration is carried out so that the X-axis direction of the reference coordinates coincides with a direction in which the three points detected for each of the marks mA through mC by driving the X direction driving portion 138X at step S130 are arranged and the Y-axis direction of the reference coordinates coincides with a direction in which the three points detected for each of the marks mA through mC by driving the Y direction driving portion 138Y at step S130 are arranged. In addition, distances along the three points of each of the marks mA through mC in the corresponding measurement visual fields 153A through 153C, the three points being arranged in the X direction, are measured, and a ratio (scale factor) of the distances obtained by the measurement with respect to the actual moving distance of the X direction driving portion 138X is obtained. Moreover, distances along the three points of each of the marks mA through mC in the corresponding measurement visual fields 153A through 153C, the three points being arranged in the Y direction, are measured, and a ratio (scale factor) of the distances obtained by the measurement with respect to the actual moving distance of the Y direction driving portion 138Y is obtained.

As stated above, because the X direction calibration and the Y direction calibration are separately carried out in the calibration process (step S100) of the axis directions of the reference coordinates, the axis directions of the reference coordinates can be more easily calibrated with high accuracy. However, the calibrations of the X direction and the Y direction may be carried out at the same time. In addition, the X direction driving portion 138X and the Y direction driving portion 138Y may be moved at the same time by a predetermined distance, so that the measurement points of the marks mA through mC of the wafer Wd are detected, and based on the detection results, the X-axis direction and the Y-axis direction may be calibrated.

(Calibration of the Origin Position of the Reference Coordinates)

Figure 14:
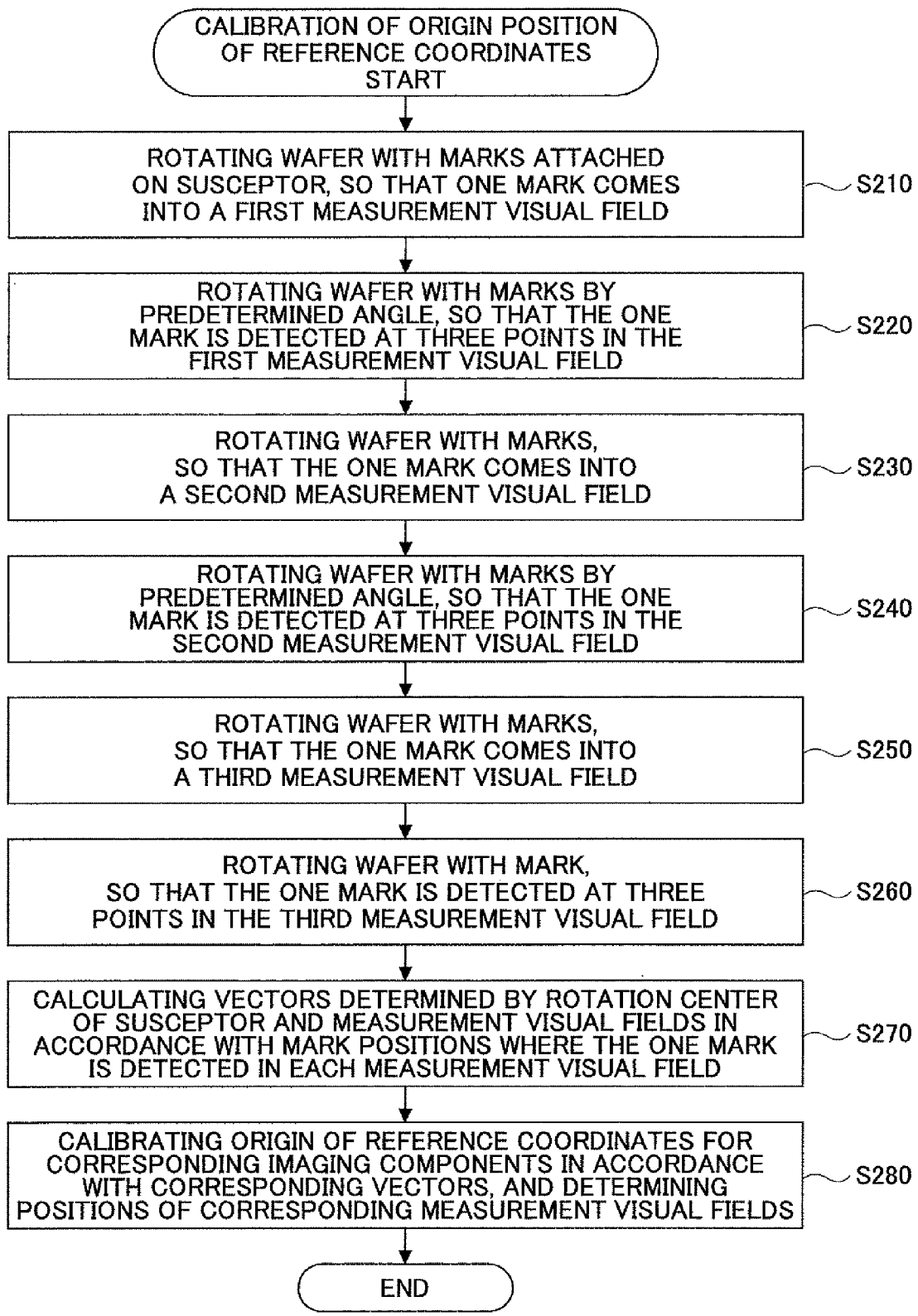
FIG. 14 is a flowchart illustrating a specific example of calibrating the origin position of the reference coordinates in the position adjustment method shown in FIG. 8.

Next, the calibration process of the origin position of the reference coordinates (step S200) is described with reference to the drawings. The calibration process of the origin position is carried out, for example, as shown in FIG. 14. At step S210 (FIG. 14), the mark-equipped wafer Wd is set on the susceptor 112 and rotated, so that one mark mD is brought into a first measurement visual field 153A. Specifically, the wafer Wd is first set on the susceptor 112 so that the rotation center of the susceptor 112 accurately coincides with the center of the wafer Wd.

Figure 15:
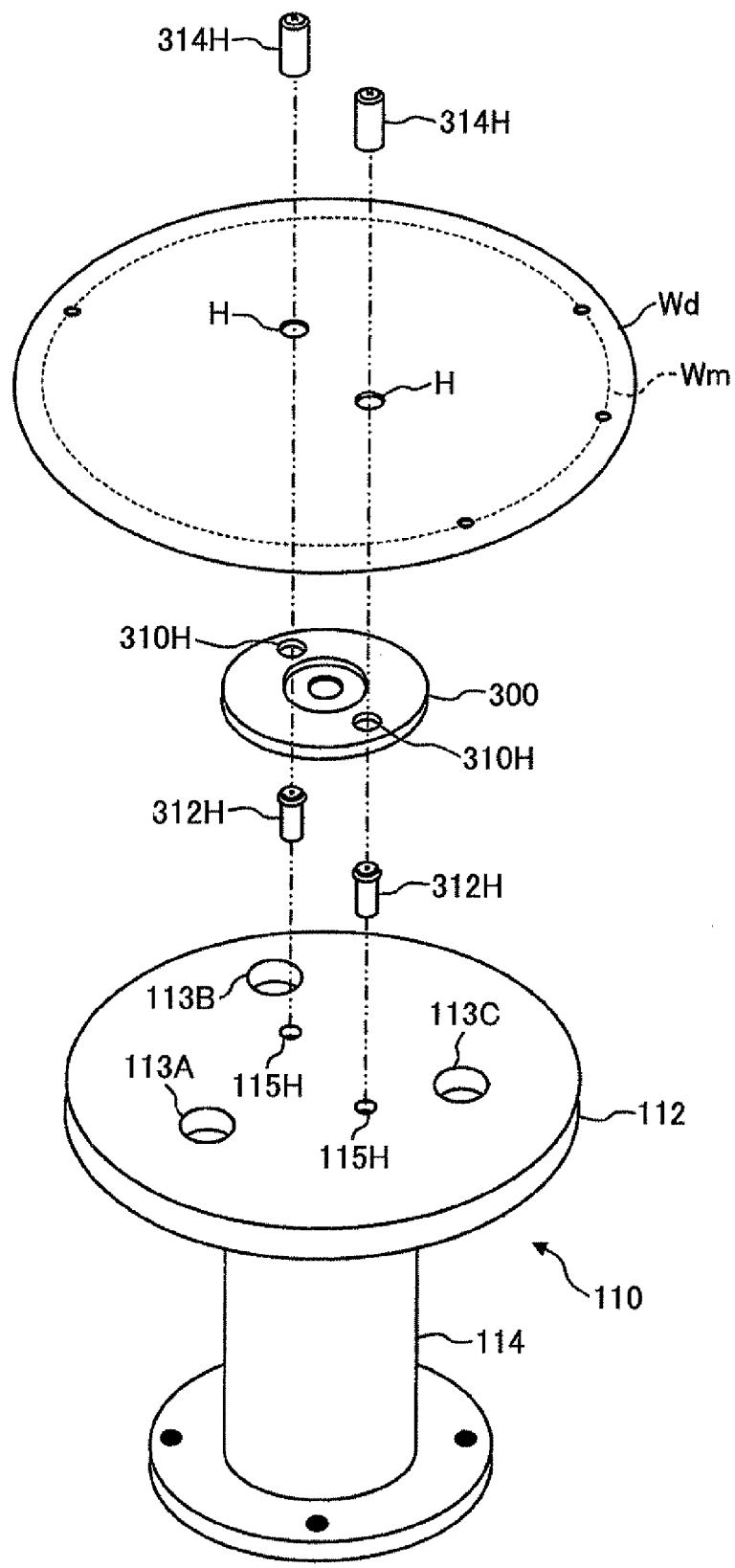
FIG. 15 is a perspective view for explaining a specific example of a method of attaching the mark-equipped wafer on a susceptor via a height adjustment jig.

A specific example of a method of accurately setting the mark-equipped wafer Wd on the susceptor 112 is explained. FIG. 15 is a perspective view for explaining the method of setting the wafer Wd on the susceptor 112 via the height adjustment jig 300, and FIG. 16 is a cross-sectional view illustrating the susceptor on which the wafer Wd is attached.

Figure 16:
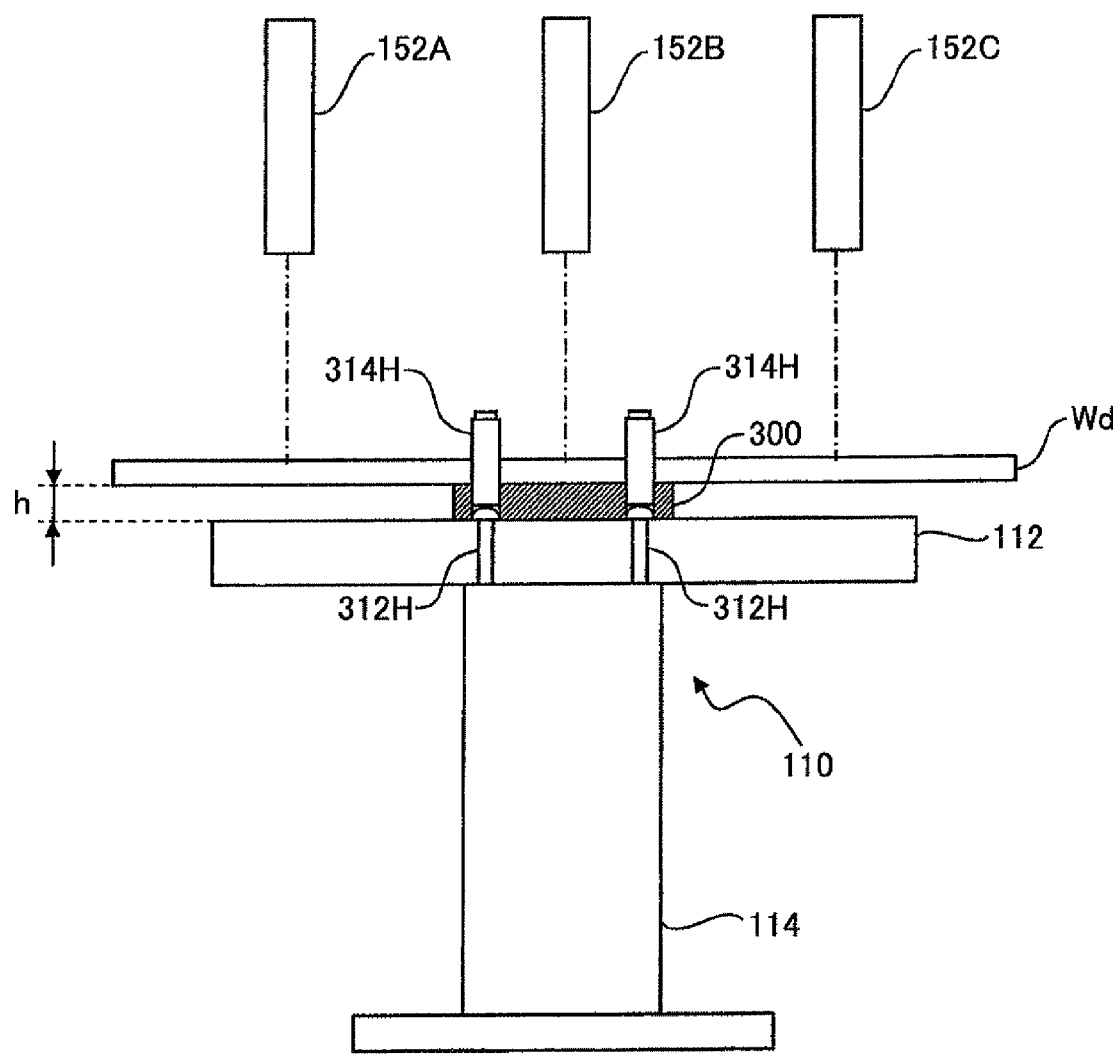
FIG. 16 is a side view illustrating the mark-equipped wafer attached on the susceptor via the height adjustment jig.

First, two jig positioning pins 312H for positioning the height adjustment jig 300 on the susceptor 112 are inserted into corresponding plural (e.g., two) positioning holes 115H formed in the susceptor 112 as shown in FIGS. 15 and 16. Next, the height adjustment jig 300 is placed on the susceptor 112 so that upper platens of the jig positioning pins 312H are inserted into corresponding through-holes 310H formed in the height adjustment jig 300. With this, the height adjustment jig 300 is positioned in a predetermined position.

Next, the wafer Wd is placed on the height adjustment jig 300 so that the through-holes 310H of the height adjustment jig 300 coincide with corresponding positioning holes H of the wafer Wd. Locking pins 314H are inserted into the corresponding holes H, thereby fixing the wafer Wd on the height adjustment jig 300.

Namely, the height adjustment jig 300 is fixed on the susceptor 112 in such a way that the plural jig positioning pins 312H arranged in the susceptor 112 are inserted into the corresponding bottom portions of the through-holes 310H of the height adjustment jig 300. The wafer Wd is fixed by inserting the plural locking pins 314H through the wafer Wd into the corresponding through-holes 310H of the height adjustment jig 300. As stated, because the susceptor 112 and the mark-equipped wafer Wd are positioned using the same through-holes 310H, the center position of the mark-equipped wafer Wd can accurately coincide with the center position of the susceptor 112. In this way, the wafer Wd is attached on the susceptor 112 so that the center position of the wafer Wd coincides with the rotation center of the susceptor 112.

A height h of the height adjustment jig 300 is determined so that the wafer Wd on the height adjustment jig 300 can be supported at the same height as the wafer W to be measured by the imaging components 152A through 152C. In this embodiment, because the circumferential portion of the wafer W is detected while the wafer W is brought up by the supporting pins 132A through 132C, the height h of the height adjustment jig 300 is determined so that the wafer Wd is supported at the same height.

In addition, because the focus has been brought to the wafer Wd supported at the above height in the process step for calibrating the axis directions (step S100), focusing at this time is not necessary.

Figure 17:
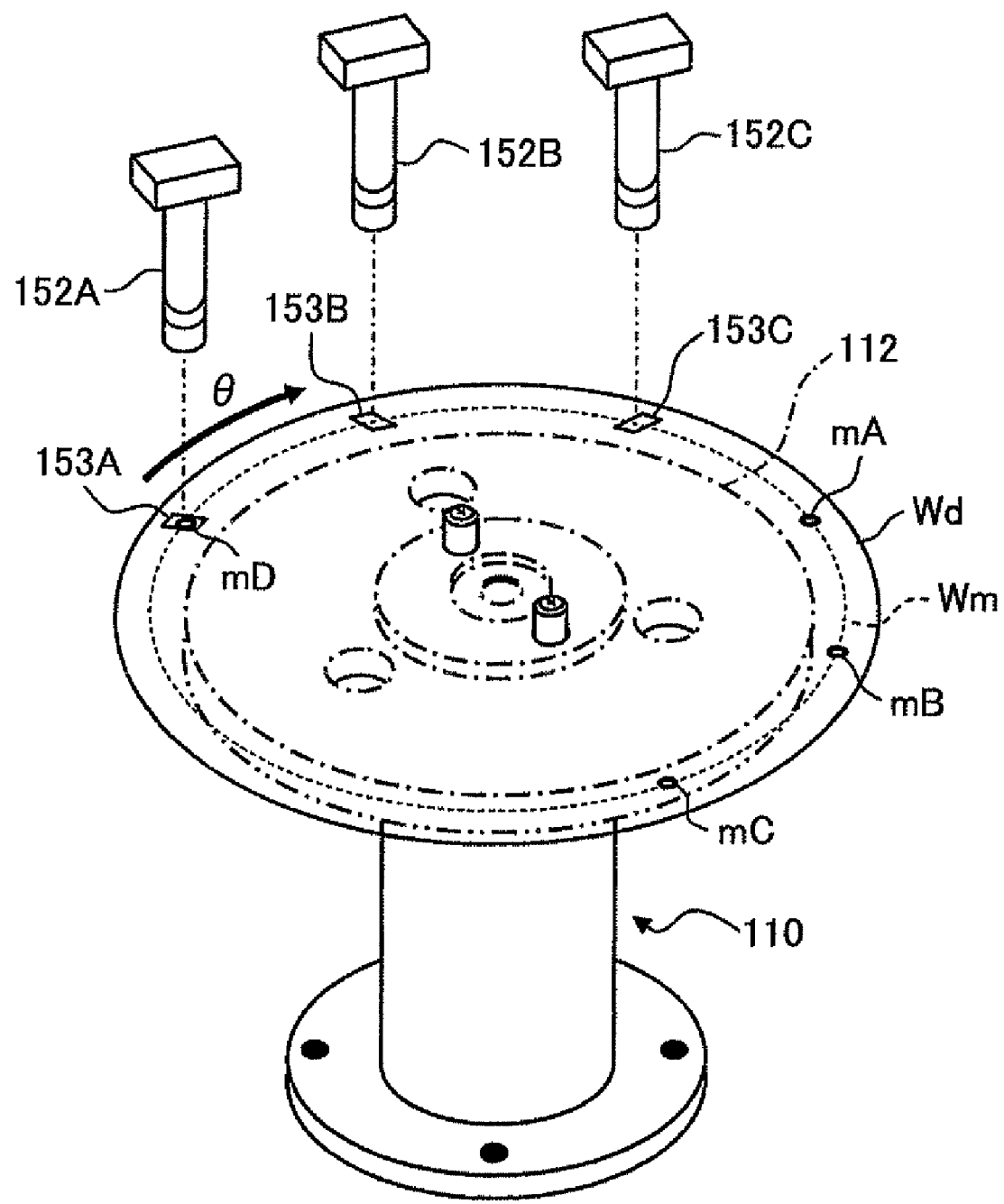
FIG. 17 is a perspective view for explaining origin position calibration carried out using the mark-equipped wafer attached on the susceptor via the height adjustment jig.
Figure 18:
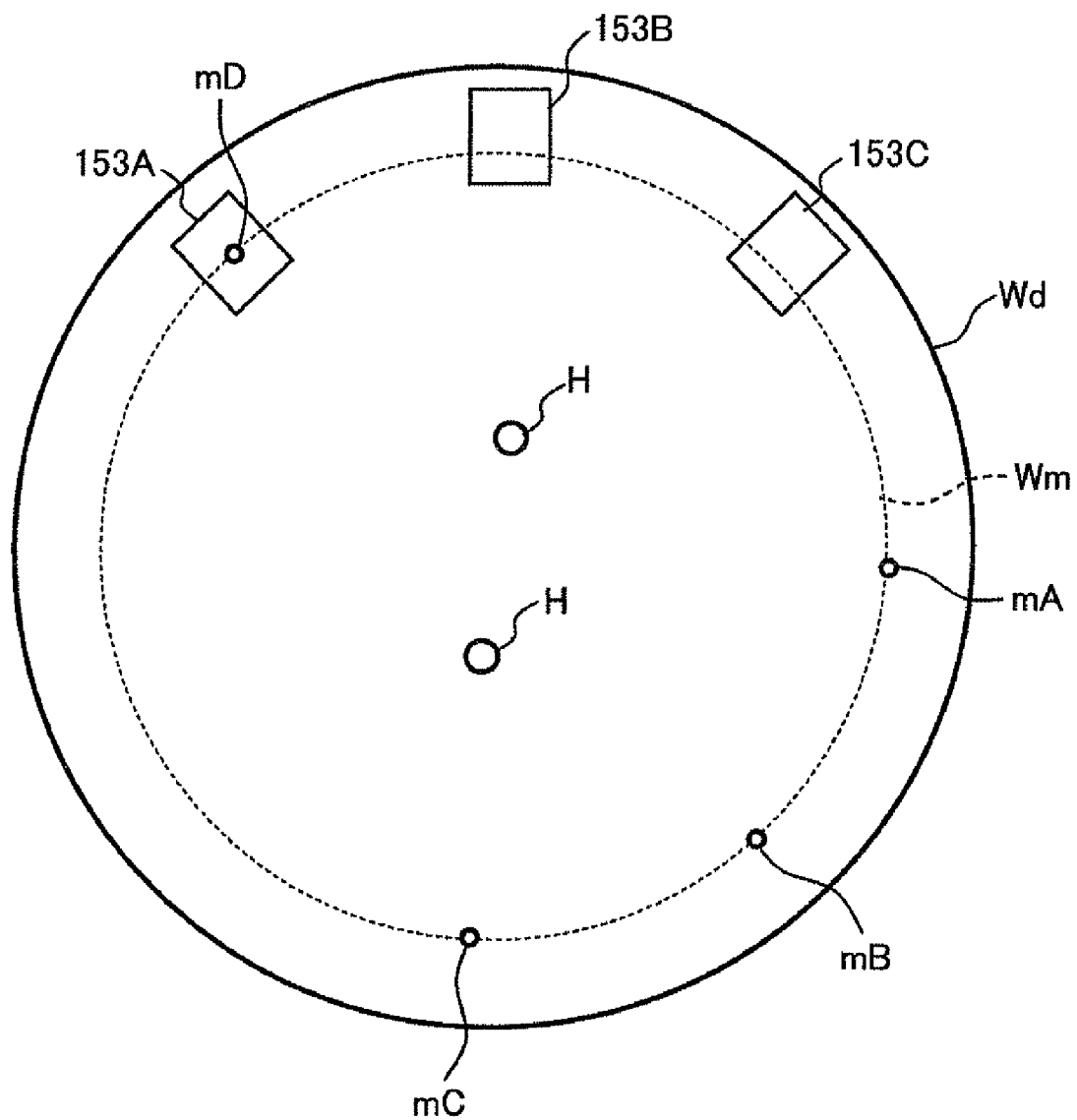
FIG. 18 shows a relationship between an origin position calibration mark of the mark-equipped wafer and a first measurement visual field, where the mark is brought into the first measurement visual field.

After the wafer Wd is attached on the susceptor 112 via the height adjustment jig 300 in the above manner, the wafer Wd is rotated by rotating the susceptor 112 as shown in FIG. 17, so that the mark mD of the wafer Wd is brought into the first measurement visual field 153A as shown in FIG. 18.

Next, the wafer Wd is rotated by a predetermined angle and the mark mD is detected at plural (e.g., three) measurement points in the first measurement visual field 153A at step S220. In this case, the mark mD is substantially at a center of the first measurement visual field 153A and measured at the three measurement points by rotating the wafer Wd by +/−0.5° from the substantial center.

Figure 19:
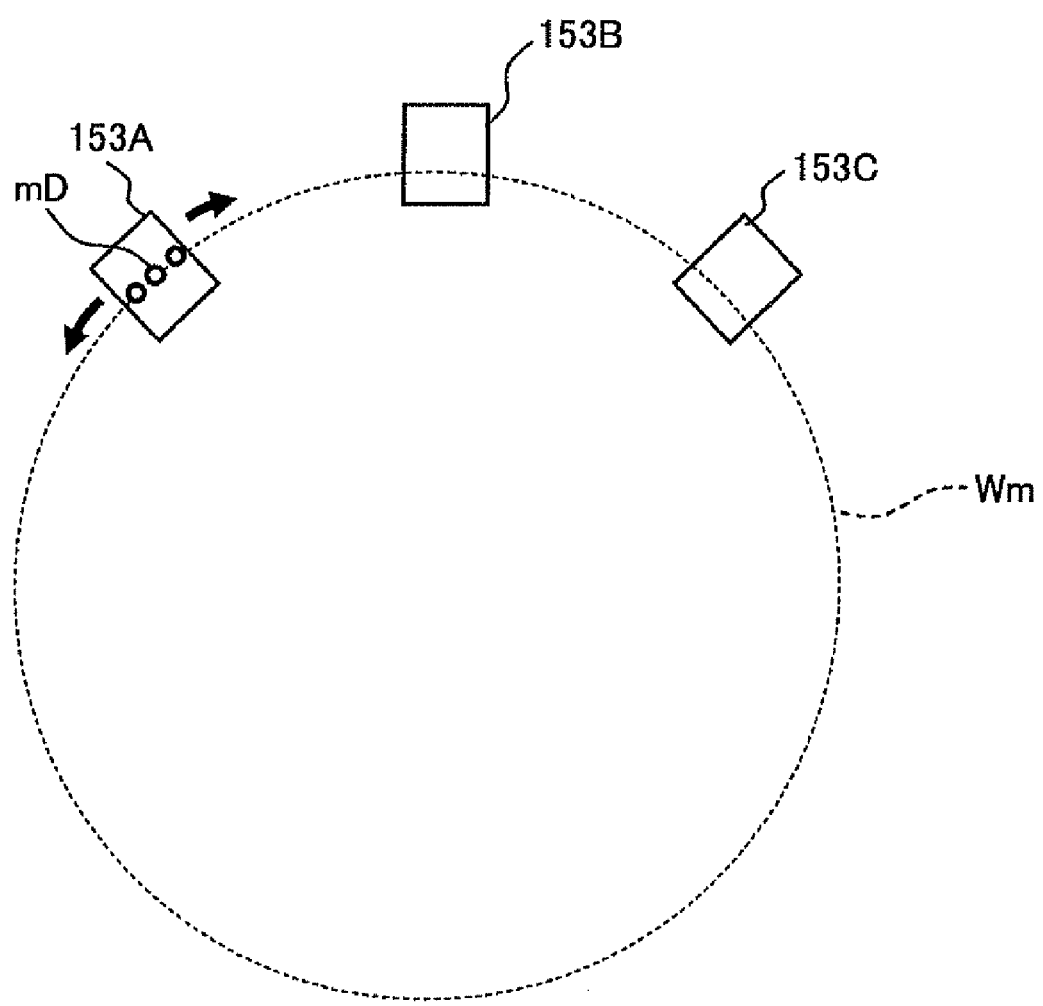
FIG. 19 is a view for explaining a rotation direction of the mark-equipped wafer and a moving direction of the origin position calibration mark in the first measurement visual field.

For example, the wafer Wd is positioned so that the mark mD is substantially at the center of the first measurement visual field 153A, and the mark mD is detected at a first point as shown in FIG. 19. Next, the wafer Wd is rotated in a counterclockwise direction by a predetermined angle (e.g., 0.5°), and the mark mD is detected at a second point. At last, the wafer Wd is rotated in a clockwise direction by a predetermined angle (e.g., 1.0°), and the mark mD is detected at a third point. These points are stored in a memory and the like.

The detecting order of the measurement points of the mark mD is not limited to the above. The wafer Wd may be rotated in one direction (the counterclockwise direction or the clockwise direction) by a predetermined angle at a time, so that the three measurement points are detected.

Next, the wafer Wd is rotated by rotating the susceptor 112 so that the mark mD is brought into a second measurement visual field 153B at step S230. Then, the mark mD is detected at plural (e.g., three) measurement points in the second measurement visual field 153B at step S240 in the same manner as described above (step S220).

Moreover, the wafer Wd is rotated by rotating the susceptor 112 so that the mark mD is brought into a third measurement visual field 153C at step S250. Then, the mark mD is detected at plural (e.g., three) measurement points in the third measurement visual field 153C at step S260 in the same manner as described above (step S220).

As stated, the calibration of the origin position of the reference coordinates is carried out by using only one mark mD in contrast to the calibration of the axis directions. While it is possible to detect mark positions by bringing three marks corresponding to the measurement visual fields 153A through 153C of the corresponding the imaging components 152A through 152C into the measurement visual fields 153A through 153C, it is advantageous in that the use of only one mark mD can reduce displacement of the rotation center position that can be caused by variations of positions where those marks are made in the wafer Wd.

The mark of the wafer Wd to be used in calibrating the origin position of the reference coordinates is not necessarily the mark mD, but may be any one of the marks mA through mC.

Next, vectors determined by the measurement visual fields 153A through 153C and a rotation center S1 are calculated in accordance with the measurement points of the mark mD detected in the measurement visual fields 153A through 153C at step S270. The rotation center S1 corresponds to the actual rotation center of the susceptor 112.

Figure 20:
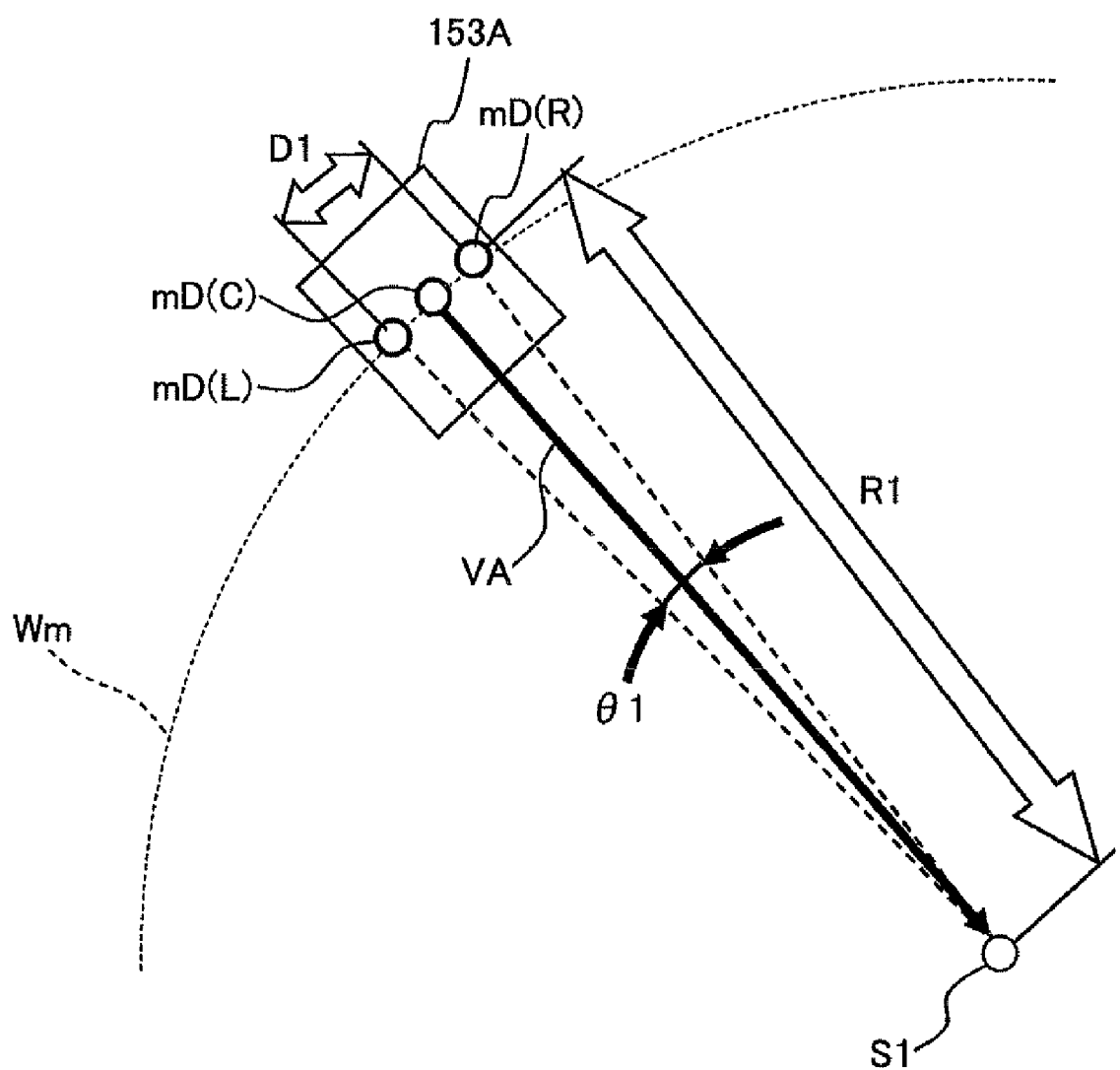
FIG. 20 is a view for explaining a vector from a point where the mark is measured in the first measurement visual field to a rotation center S1.

A specific example of a method of calculating the vectors determined by the measurement visual fields 153A through 153C and the rotation center S1 is explained with reference to FIG. 20. In FIG. 20, among the three measurement points detected for the mark mD in the first measurement visual field 153A, a center point is referred to as mD(C), a point at the right hand side of mD(C) is referred to as mD(R), and a point at the left hand side of mD(C) is referred to as mD(L). Based on these three points, a vector VA is obtained that has a starting point at mD(C) and an ending point at the rotation center S1, as follows.

Figure 21:
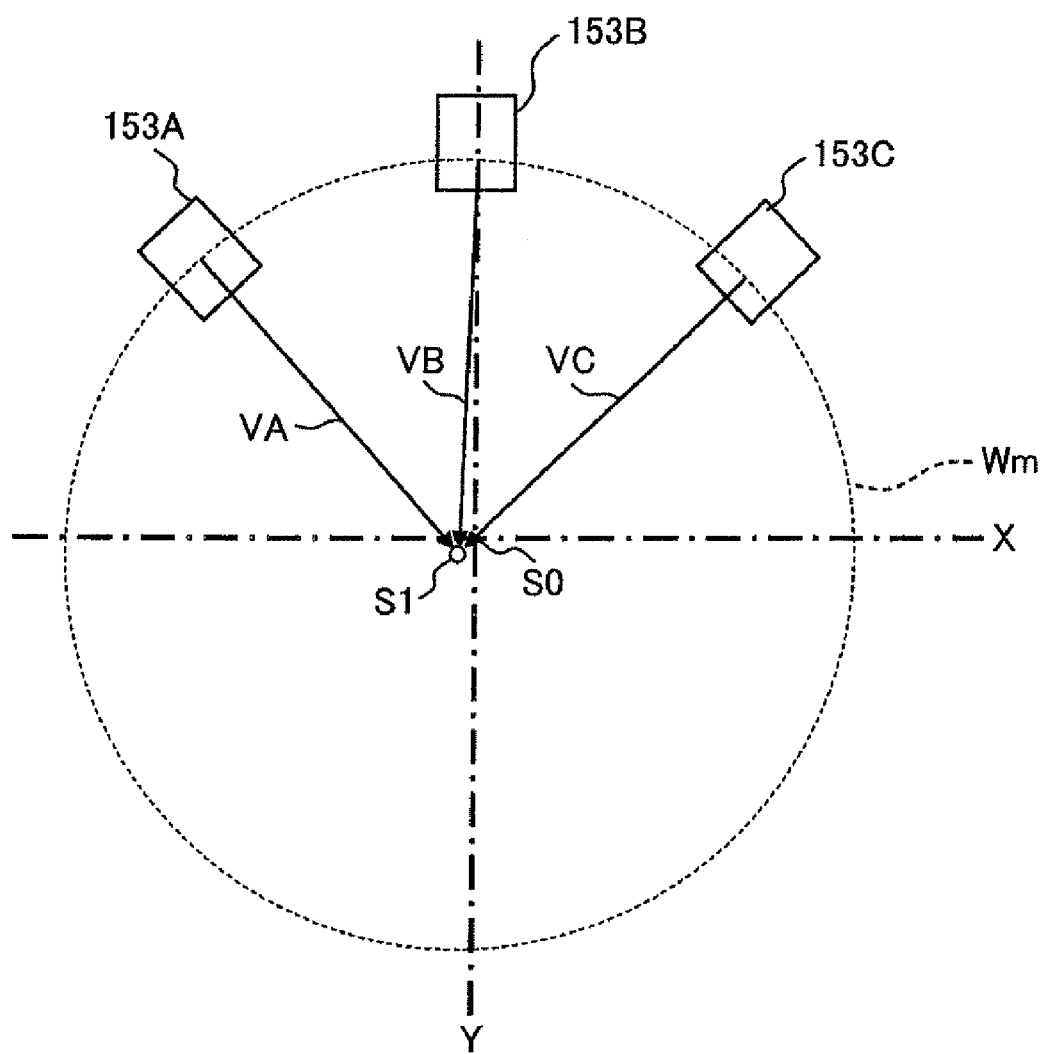
FIG. 21 shows vectors obtained in three measurement visual fields.

When it is assumed that a distance between mD(L) and mD(R) is D and a distance between the rotation center S1 and mD(C) is R1, R1 corresponds to a radius of a circle that has the rotation center S1 as the center and the three points mD(C), mD(R), and mD(L) on its circumference. On the other hand, a triangle having triangle vertices at the rotation center S1, mD(L) and mD(R) is an isosceles triangle having an included angle of $\theta 1$. Therefore, the relationship: $D1/2 = R1 \times \sin(\theta 1/2)$ holds true. Because $\theta 1$ is one degree in this embodiment, R1 can be obtained from the above relationship by obtaining D1. Next, a unit vector in the direction from the mD(C) to the rotation center S1 is obtained, and a vector VA for the first measurement visual field 153A is obtained by multiplying the unit vector by the radius R1 obtained above. In the same manner, vectors VB, VC for the respective measurement visual fields 153B, 153C can be obtained, as shown in FIG. 21.

Figure 22:
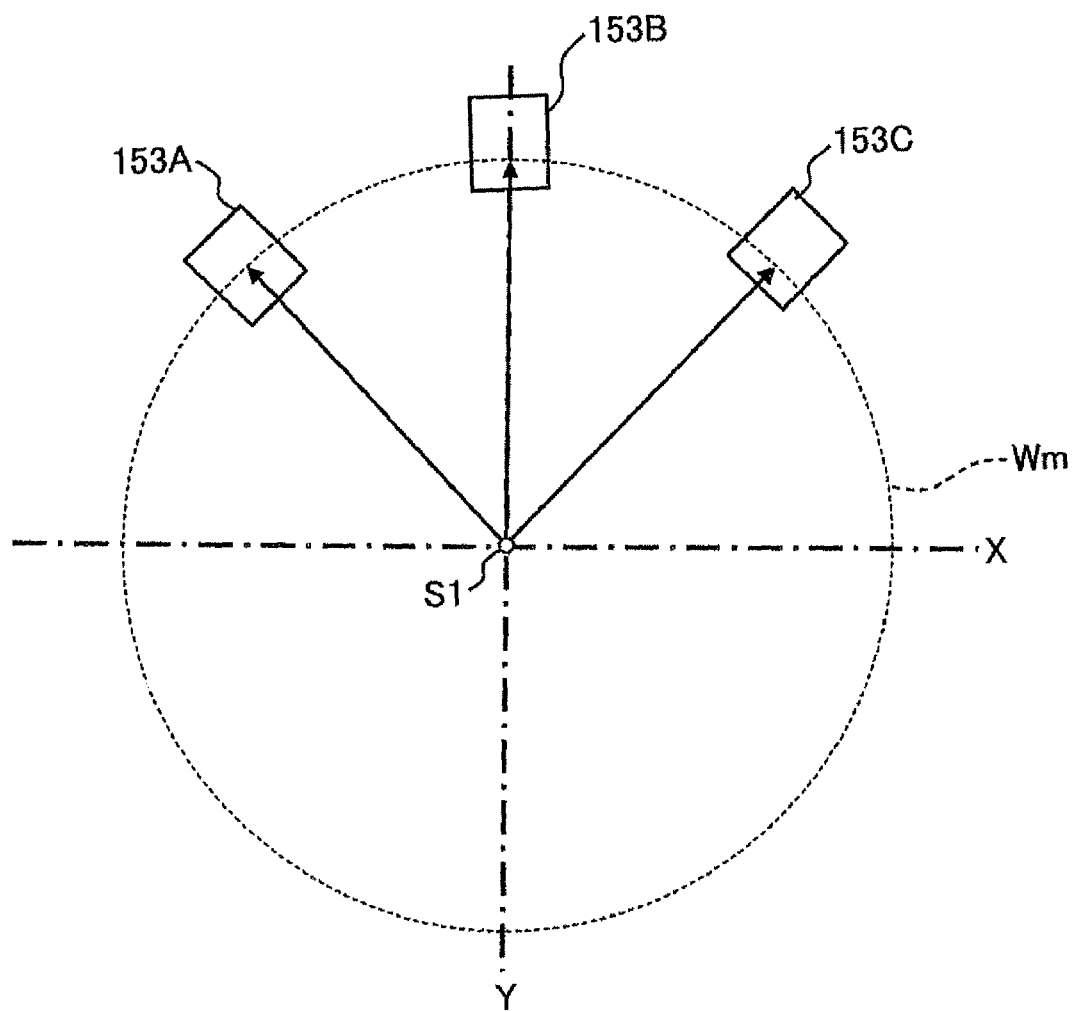
FIG. 22 shows new reference coordinates calibrated in accordance with the vectors obtained in the three measurement visual fields and positions of measurement visual fields.

Next, the origin S0 of the reference coordinates for the imaging components 152A through 152C is calibrated in accordance with the vectors VA, VB, VC at step S280, and thus the positions of the measurement visual fields 153A through 153C are determined. For example, the measurement visual fields 153A through 153C are adjusted by calibrating the origin S0 of the reference coordinates so that the rotation center S1 shown in FIG. 21 corresponds to the origin S0 of the reference coordinates. An example of the calibrated reference coordinates calibrated in such a manner is shown in FIG. 22. As shown, the measurement visual fields 153A through 153C are positioned at corresponding end points of vectors that have starting points at the origin (S1) of the new reference coordinates whose X direction, Y direction, and origin are calibrated, and has the opposite direction of the corresponding vectors VA, VB, VC.

In such a manner, the positions of the measurement visual fields 153A through 153C of the corresponding imaging components 152A through 152C are established on the same reference coordinates whose origin is at the rotation center (S1) of the susceptor 112. With this, the positions of the imaging components 152A through 152C on the reference coordinates can be adjusted so that displacements of the imaging components 152A through 152C due to installation errors of the imaging components 152A through 152C are eliminated.

As explained above, according to this embodiment, because the calibration of the axis directions (XY-axis directions) and the calibration of the origin position of the reference coordinates are separately carried out by using the susceptor 112 that can rotate the wafer W and the substrate transferring apparatus 130 that can move the wafer W in the XY directions and is provided independently from the susceptor 112, the positions of the measurement visual fields 153A through 153C of the corresponding imaging components 152A through 152C can be easily calibrated with high accuracy without re-installing the imaging components 152A through 152C, even when there are installation errors of the imaging components 152A through 152C. Therefore, the position of the wafer W can be detected with high accuracy.

While the present invention has been described referring to the foregoing embodiments, the present invention is not limited to the specifically disclosed embodiments, but modification or alteration may be considered within the scope of the Claims.

The present application is based on Japanese Patent Application No. 2007-032487 filed with the Japanese Patent Office on Feb. 13, 2007, the entire contents of which are hereby incorporated herein by reference.

INDUSTRIAL APPLICABILITY

The present invention is applicable to a substrate position detection apparatus and an imaging component position adjustment method.

The invention claimed is:

1. An imaging component position adjustment method for adjusting an arrangement of coordinates in an imaging area of an imaging component in a substrate imaging plane in a substrate position detection apparatus that detects a position of a substrate in accordance with an image taken of a circumferential portion of the substrate by the imaging component, the substrate position detection apparatus being arranged in a vicinity of a rotatable susceptor on which the substrate is placed and a substrate transferring apparatus that is prepared separately from the susceptor and configured to horizontally drive a supporting pin for transferring the substrate to and/or from the susceptor, the imaging component position adjustment method comprising steps of:

supporting a mark-equipped wafer in which a mark is arranged corresponding to the circumferential portion of the substrate at a predetermined height above the susceptor by the supporting pin, bringing the mark into the imaging area, detecting the mark at plural points while horizontally moving the mark in one direction within the imaging area by a predetermined distance by horizontally driving the supporting pin, and calibrating an axis direction of the coordinates in accordance with a direction in which the plural points are arranged; and maintaining the mark-equipped wafer with a height adjustment jig at the predetermined height above the susceptor, bringing the mark into the imaging area, detecting the mark at plural points while moving the mark within the imaging area by a predetermined angle by rotating the susceptor, and calibrating an origin position of the coordinates in accordance with a rotation center calculated in accordance with the plural points.

2. The imaging component position adjustment method of claim 1, wherein the substrate transferring apparatus is configured so that the supporting pin may be driven in an X direction and a Y direction, wherein, in calibrating the axis direction, the mark is detected at first plural points while moving the mark in the X direction within the imaging area by a predetermined distance by driving the supporting pin in the X direction, thereby matching an X-axis direction of the coordinates with a direction in which the first plural points are arranged; and the mark is detected at second plural points while moving the mark in the Y direction within the imaging area by a predetermined distance by driving the supporting pin in the Y direction, thereby matching a Y-axis direction of the coordinates with a direction in which the second plural points are arranged.

3. The imaging component position adjustment method of claim 1, wherein the substrate position detection apparatus includes plural of the imaging components, wherein the plural imaging components are arranged apart from each other along and above the circumferential portion of the substrate, wherein the mark-equipped wafer includes plural marks whose number is more than or equal to the number of the plural imaging components, and wherein the plural marks are arranged in the mark-equipped wafer so that the imaging components may observe at least one of the plural marks.

4. The imaging component position adjustment method of claim 1, wherein the substrate position detection apparatus includes plural of the imaging components, wherein the plural imaging components are arranged apart from each other along and above the circumferential portion of the substrate, wherein, in calibrating the origin position of the coordinates, the mark is brought into plural imaging areas corresponding to the plural imaging components in turn by rotating the mark-equipped wafer, and wherein the same mark is detected at plural points in each of the plural imaging areas.

5. The imaging component position adjustment method of claim 3, wherein the mark-equipped wafer includes plural marks to be used in calibrating the axis direction of the coordinates, and wherein one of the plural marks is used also in calibrating the origin position of the coordinates.

6. The imaging component position adjustment method of claim 1, wherein the height adjustment jig includes plural through-holes,
wherein the height adjustment jig is attached on the susceptor by inserting first plural pins arranged in the susceptor into lower portions of the corresponding plural through-holes, and
wherein the mark-equipped wafer is attached on the height adjustment jig by inserting second plural pins that penetrate through the mark-equipped wafer into upper portions of the corresponding plural through-holes.

7. A substrate position detection apparatus that detects a position of a substrate in accordance with an image taken of a circumferential portion of the substrate by an imaging component, the substrate position detection apparatus being arranged in a vicinity of a rotatable susceptor on which the substrate is placed and a substrate transferring apparatus that is prepared separately from the susceptor and configured to drive a supporting pin for transferring the substrate to and/or from the susceptor in an X direction and a Y direction, the substrate position detection apparatus comprising:
an imaging area of the imaging component in a substrate imaging plane, wherein an arrangement of coordinates of the imaging is adjusted by
a step of supporting a mark-equipped wafer in which a mark is arranged corresponding to the circumferential portion of the substrate at a predetermined height above the susceptor by the supporting pin, detecting the mark at first plural points while moving the mark in the X direction within the imaging area by a predetermined distance by driving the supporting pin in the X direction, detecting the mark at second plural points while moving the mark in the Y direction within the imaging area by a predetermined distance by driving the supporting pin in the Y direction, calibrating an X-axis direction of the coordinates in accordance with the first plural points, and calibrating a Y-axis direction of the coordinates in accordance with the second plural points; and
a step of maintaining the mark-equipped wafer with a height adjustment jig at the predetermined height above the susceptor, detecting the mark at third plural points while moving the mark within the imaging area by a predetermined angle by rotating the susceptor, and calibrating an origin position of the coordinates in accordance with a rotation center calculated in accordance with the third plural points.

8. An imaging component position adjustment method for adjusting an arrangement of coordinates in an imaging area of an imaging component in a substrate imaging plane in a substrate position detection apparatus that detects a position of a substrate in accordance with an image taken of a circumferential portion of the substrate by the imaging component, the substrate position detection apparatus being arranged in a vicinity of a rotatable susceptor on which the substrate is placed and a substrate transferring apparatus that is prepared separately from the susceptor and configured to drive a supporting pin for transferring the substrate to and/or from the susceptor in an X direction and a Y direction, the imaging component position adjustment method comprising steps of:
supporting a mark-equipped wafer in which a mark is arranged corresponding to the circumferential portion of the substrate at a predetermined height above the susceptor by the supporting pin, detecting the mark at first plural points while moving the mark in the X direction within the imaging area by a predetermined distance by driving the supporting pin in the X direction, detecting the mark at second plural points while moving the mark in the Y direction within the imaging area by a predetermined distance by driving the supporting pin in the Y direction, calibrating an X-axis direction of the coordinates in accordance with the first plural points; and calibrating a Y-axis direction of the coordinates in accordance with the second plural points; and
maintaining the mark-equipped wafer with a height adjustment jig at the predetermined height above the susceptor, detecting the mark at third plural points while moving the mark within the imaging area by a predetermined angle by rotating the susceptor, and calibrating an origin position of the coordinates in accordance with a rotation center calculated in accordance with the third plural points.

* * * * *